(12) United States Patent
Hong et al.

(10) Patent No.: US 12,707,829 B2
(45) Date of Patent: Aug. 11, 2026

(54) DISPLAY APPARATUS AND METHOD OF PROVIDING THE SAME

(71) Applicant: Samsung Display Co., Ltd., Yongin-si (KR)

(72) Inventors: Pilsoon Hong, Yongin-si (KR); Gwuihyun Park, Yongin-si (KR); Junho Sim, Yongin-si (KR); Jaehun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 537 days.

(21) Appl. No.: 18/178,625

(22) Filed: Mar. 6, 2023

(65) Prior Publication Data

US 2023/0292559 A1 Sep. 14, 2023

(30) Foreign Application Priority Data

Mar. 10, 2022 (KR) ........................ 10-2022-0030316

(51) Int. Cl.
*H10K 59/124* (2023.01)
*H10K 59/12* (2023.01)
*H10K 59/122* (2023.01)

(52) U.S. Cl.
CPC ....... *H10K 59/124* (2023.02); *H10K 59/1201* (2023.02); *H10K 59/122* (2023.02)

(58) Field of Classification Search
CPC ............... H10K 59/124; H10K 59/131; H10K 59/1201; H10K 59/122
See application file for complete search history.

(56) References Cited

U.S. PATENT DOCUMENTS

| | | | |
|---|---|---|---|
| 7,495,716 | B2 | 2/2009 | Kang et al. |
| 9,748,318 | B2 | 8/2017 | Shim et al. |
| 10,692,947 | B2 | 6/2020 | Kim et al. |
| 10,854,693 | B2 | 12/2020 | Shim et al. |

(Continued)

FOREIGN PATENT DOCUMENTS

| | | | |
|---|---|---|---|
| CN | 110875366 | A | 3/2020 |
| CN | 113178524 | A | 7/2021 |

(Continued)

*Primary Examiner* — Vongsavanh Sengdara
(74) *Attorney, Agent, or Firm* — CANTOR COLBURN LLP

(57) ABSTRACT

A display apparatus includes a substrate including a display area including a first pixel area and a second pixel area which are adjacent to each other along a first direction, and a peripheral area outside the display area, a organic insulating layer disposed over the substrate, a connection metal layer disposed on the organic insulating layer, and a planarization layer covering the connection metal layer. The planarization layer includes a first inner surface defining a contact hole corresponding to the first pixel area and exposing at least a part of a connection metal layer to outside the planarization layer, the first inner surface being a forward-tapered inclined surface, and a second inner surface defining a 1-1$^{st}$ hole which is between the first pixel area and the second pixel area along the first direction and exposes a part of the organic insulating layer to outside the planarization layer, the second inner surface being a reverse-tapered inclined surface.

16 Claims, 18 Drawing Sheets

(56) References Cited

U.S. PATENT DOCUMENTS

| | | | | |
|---|---|---|---|---|
| 11,183,669 | B2 | 11/2021 | Lim et al. | |
| 11,201,197 | B2 | 12/2021 | Lim et al. | |
| 11,302,758 | B2 | 4/2022 | Jeon et al. | |
| 11,444,140 | B2 | 9/2022 | Seo et al. | |
| 11,476,442 | B2 | 10/2022 | Bang et al. | |
| 2020/0020878 | A1 | 1/2020 | Ajiki et al. | |
| 2020/0075698 | A1 | 3/2020 | Yang et al. | |
| 2022/0165822 | A1* | 5/2022 | Jia | H10K 77/111 |
| 2024/0120259 | A1* | 4/2024 | Takeuchi | H10W 20/023 |

FOREIGN PATENT DOCUMENTS

| | | | |
|---|---|---|---|
| EP | 4207987 | A1 | 7/2023 |
| JP | 2018156882 | A | 10/2018 |
| KR | 20070019838 | A | 2/2007 |
| KR | 1020160119301 | A | 10/2016 |
| KR | 1020170015637 | A | 2/2017 |
| KR | 20180068549 | A | 6/2018 |
| KR | 20180072515 | A | 6/2018 |
| KR | 1020190140348 | A | 12/2019 |
| KR | 102067968 | B1 | 1/2020 |
| KR | 20200014053 | A | 2/2020 |
| KR | 20200062464 | A | 6/2020 |
| KR | 20200137071 | A | 12/2020 |
| KR | 20210028789 | A | 3/2021 |
| KR | 20210149984 | A | 12/2021 |

* cited by examiner

PX2
OLED2
PX1
OLED1
PX3
OLED3
210-2
220-2
210-1
220-1
210-3
220-3
222L-2
222U-2
222L-1
222U-1
222L-3
222U-3
221
223
224
225
227
230
215
209
CM
208
207
205
203
201
100
C
D
A
B
310
320
400
DL
DE
Act
CE1
CE2
Cst
GE
TFT
SE
PC
PXA2
H1
PXA1
H2
PXA3
DA
PA
III
III'
IV
IV'
Z
222U-1
222L-1
222-1
222U-2
222L-2
222-2
222U-3
222L-3
222-3

FIG. 13

M
SU1
SPU1
SU2-1
PU
SU2-2
SU3
SPU2
260
CM
208
207
205
203
201
100
III
III'
IV
IV'
400
DL
DE
Act
CE1
CE2
Cst
GE
TFT
SE
PC
DA
PA
Z

FIG. 14

DISPLAY APPARATUS AND METHOD OF PROVIDING THE SAME

This application claims priority to Korean Patent Application No. 10-2022-0030316, filed on Mar. 10, 2022, and all the benefits accruing therefrom under 35 U.S.C. § 119, the disclosure of which is incorporated by reference herein in its entirety.

BACKGROUND

1. Field

One or more embodiments relate to a display apparatus and a method of manufacturing (or providing) the same. More particularly, one or more embodiments relate to a display apparatus in which leakage (electrical) current and costs of manufacturing (or providing) the display apparatus may be reduced, and a method of manufacturing (or providing) the display apparatus.

2. Description of the Related Art

Some layers included in a display apparatus are commonly provided over a plurality of display elements. Accordingly, when electrical current is supplied to one display element, electrical current may be supplied to other adjacent display elements through layers commonly provided over a plurality of display elements.

SUMMARY

When electrical current is supplied to other adjacent display elements through layers commonly provided over the plurality of display elements, color purity of a display apparatus may be degraded. In order to solve the problem, the display apparatus may include an organic film separator or the like.

Display apparatuses in the related art have problems in that in order to form a separator, a process for manufacturing (or providing) a display apparatus may be complicated and costs may increase.

In order to solve various problems including the above problems, one or more embodiments include display apparatuses in which leakage current may be reduced and manufacturing costs may be reduced and methods of manufacturing the display apparatuses. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus includes a substrate including a display area including a first pixel area and a second pixel area that are adjacent to each other in a first direction, and a peripheral area outside the display area, and a planarization layer including a contact hole located in the first pixel area to expose at least a part of a connection metal layer under the planarization layer and a 1-1$^{st}$ hole located between the first pixel area and the second pixel area, where an inner surface of the contact hole includes a forward-tapered inclined surface, and an inner surface of the 1-1$^{st}$ hole includes a reverse-tapered inclined surface.

The first pixel area and the second pixel area may be arranged in the first direction, where the 1-1$^{st}$ hole extends in a second direction which intersects the first direction.

The display area further may include a third pixel area located adjacent to the first pixel area in the second direction, where the planarization layer further includes a 2-1$^{st}$ hole located between the first pixel area and the third pixel area and extending in the first direction, where an inner surface of the 2-1$^{st}$ hole includes a reverse-tapered inclined surface.

The 1-1$^{st}$ hole and the 2-1$^{st}$ hole may be connected to each other.

The display apparatus may further include a pixel-defining film located on the planarization layer and including a 1-2$^{nd}$ hole overlapping the 1-1$^{st}$ hole.

An inner surface of the 1-2$^{nd}$ hole may include a forward-tapered inclined surface.

The display area may further include a third pixel area located adjacent to the first pixel area in a second direction which intersects the first direction, where the planarization layer further includes a 2-1$^{st}$ hole located between the first pixel area and the third pixel area and extending in the first direction and an inner surface of the 2-1$^{st}$ hole includes a reverse-tapered inclined surface, and the pixel-defining film further includes a 2-2$^{nd}$ hole overlapping the 2-1$^{st}$ hole and an inner surface of the 2-2$^{nd}$ hole includes a forward-tapered inclined surface.

The 1-2$^{nd}$ hole and the 2-2$^{nd}$ hole may be connected to each other.

The display apparatus may further include a pad located in the peripheral area.

The planarization layer may cover the pad, and may include a pad hole through which at least a part of the pad is exposed, where an inner surface of the pad hole includes a forward-tapered inclined surface.

A thickness of the planarization layer on the pad may be less than a thickness of the planarization layer in the display area.

The display apparatus may further include a pixel electrode located between the planarization layer and the pixel-defining film, a counter electrode covering the pixel-defining film, and an intermediate layer located between the pixel electrode and the counter electrode.

The intermediate layer and the counter electrode may cover an inner surface of the 1-2$^{nd}$ hole.

The intermediate layer and the counter electrode may not cover the inner surface of the 1-1$^{st}$ hole.

The display apparatus may further include an organic insulating layer located under the planarization layer, and a residual layer located on the organic insulating layer to be located in the 1-1$^{st}$ hole, where the residual layer includes a same material as at least a part of a material included in the intermediate layer, and includes a same material as a material of the counter electrode.

The residual layer may not contact the inner surface of the 1-1$^{st}$ hole.

According to one or more embodiments, a method of manufacturing (or providing) a display apparatus includes forming (or providing) a connection metal layer on a substrate, forming a planarization layer forming layer (e.g., preliminary planarization layer) to cover the connection metal layer by applying a negative photoresist, placing, on the planarization layer forming layer, a halftone mask including a first shielding portion, a first semi-transmitting portion surrounding the first shielding portion, and a 2-1$^{st}$ shielding portion spaced apart from the first shielding portion and the first semi-transmitting portion, and exposing the planarization layer forming layer through the halftone mask, to provide a planarization layer having a plurality of inner surfaces.

The placing of the halftone mask may include locating the first shielding portion and the first semi-transmitting portion on the connection metal layer, and spacing the 2-1$^{st}$ shielding portion apart from the connection metal layer in a first direction.

The halftone mask may include a 2-2$^{nd}$ shielding portion spaced apart from the first shielding portion and the first semi-transmitting portion, where the placing of the halftone mask includes locating the first shielding portion and the first semi-transmitting portion on the connection metal layer, spacing the 2-1$^{st}$ shielding portion apart from the connection metal layer in a first direction, and spacing the 2-2$^{nd}$ shielding portion apart from the connection metal layer in a second direction which intersects the first direction.

The 2-1$^{st}$ shielding portion and the 2-2$^{nd}$ shielding portion may be connected to each other.

According to one or more embodiments, a method of manufacturing a display apparatus includes forming a connection metal layer and a pad on a substrate, forming a planarization layer forming layer to cover the connection metal layer and the pad by applying a negative photoresist, placing, on the planarization layer forming layer, a halftone mask including a first shielding portion, a first semi-transmitting portion surrounding the first shielding portion, a 2-1$^{st}$ shielding portion spaced apart from the first shielding portion and the first semi-transmitting portion, a third shielding portion, and a second semi-transmitting portion surrounding the third shielding portion, and exposing the planarization layer forming layer through the halftone mask, to provide a planarization layer having a plurality of inner surfaces.

The placing of the halftone mask may include locating the first shielding portion and the first semi-transmitting portion on the connection metal layer, spacing the 2-1$^{st}$ shielding portion apart from the connection metal layer in a first direction, and locating the third shielding portion and the second semi-transmitting portion on the pad.

Other aspects, features, and advantages of the disclosure will become more apparent from the detailed description, the claims, and the drawings.

BRIEF DESCRIPTION OF THE DRAWINGS

The above and other aspects, features, and advantages of embodiments will be more apparent from the following description taken in conjunction with the accompanying drawings, in which:

FIGS. 11 through 15 are cross-sectional views schematically illustrating a method of providing the display apparatus of FIG. 1.

DETAILED DESCRIPTION

Figure 1:
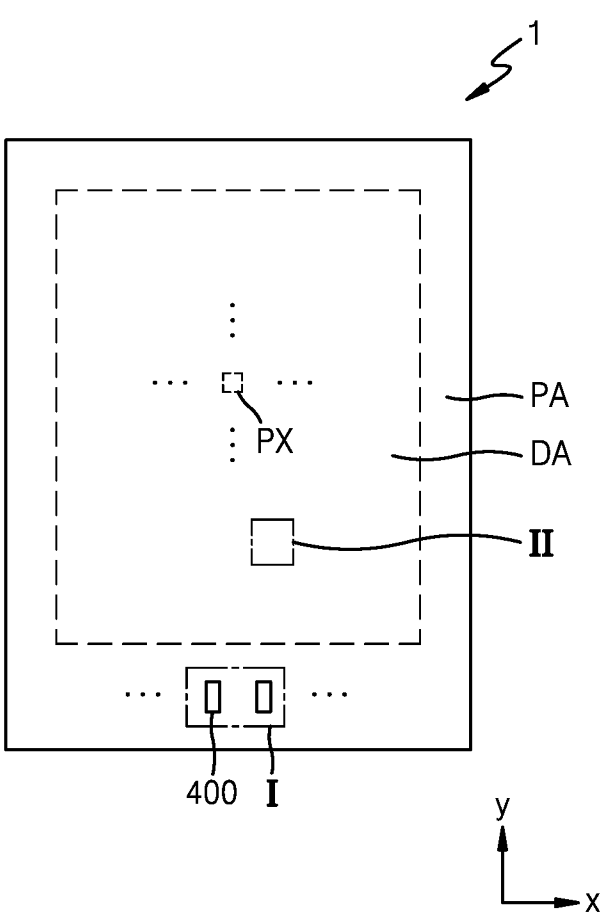
FIG. 1 is a plan view schematically illustrating a display apparatus, according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting. As used herein, the singular forms "a," "an," and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, where the same or corresponding elements are denoted by the same reference numerals throughout and a repeated description thereof is omitted. As used herein, a reference number may indicate a singular element or a plurality of the element. For example, a reference number labeling a singular form of an element within the drawing figures may be used to reference a plurality of the singular element within the text of specification.

It will be understood that when a component, such as a layer, a film, a region, or a plate, is referred to as being related to another element such as being "on" another component, the component may be directly on the other component or intervening components may be present therebetween. In contrast, when a component, such as a layer, a film, a region, or a plate, is referred to as being related to another element such as being "directly on" another component, no intervening component is present therebetween.

Also, sizes of components in the drawings may be exaggerated or contracted for convenience of explanation. For example, since sizes and thicknesses of elements in the drawings are arbitrarily illustrated for convenience of explanation, the disclosure is not limited thereto.

In the following embodiments, the x-axis (e.g., x direction), the y-axis (e.g., y direction) and the z-axis (e.g., z direction) are not limited to three axes of the rectangular coordinate system, and may be interpreted in a broader sense. For example, the x-axis, the y-axis, and the z-axis may be perpendicular to one another, or may represent different directions that are not perpendicular to one another.

Although the terms "first," "second," etc. may be used to describe various elements, these elements should not be limited by these terms. These terms are only used to distinguish one element from another.

It will be further understood that the terms "comprises" or "comprising" used herein specify the presence of stated features or components, but do not preclude the presence or addition of one or more other features or components.

"A and/or B" is used herein to select only A, select only B, or select both A and B. "At least one of A and B" is used to select only A, select only B, or select both A and B.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view schematically illustrating a part of a display apparatus 1, according to an embodiment. As shown in FIG. 1, the display apparatus 1 may include a display area DA where a pixel PX provided in plural including a plurality of pixels PX are located, and a peripheral area PA located outside (e.g., adjacent to) the display area DA. In detail, the peripheral area PA may entirely surround the display area DA. It may be understood that a substrate 100 included in the display apparatus 1 includes the display area DA and the peripheral area PA. That is, various components or layers of the display apparatus 1 may include a display area DA and a peripheral area PA corresponding to those described above.

Each pixel PX of the display apparatus 1 is an area (e.g., a planar area) where light of a certain color may be emitted. The display apparatus 1 may provide an image by using light emitted by the pixels PX. For example, each pixel PX may emit green light, red light, or blue light.

The display area DA may have a polygonal shape such as a quadrangular shape as shown in FIG. 1. For example, in a plan view (e.g., a view of the plane defined by the x direction and the y direction in FIG. 1), the display area DA may have a rectangular shape in which a horizontal length is greater than a vertical length, a rectangular shape in which a horizontal length is less than a vertical length, or a square shape. Alternatively, the display area DA may have any of various shapes such as an elliptical shape or a circular shape.

The peripheral area PA may be a non-display area where pixels PX are not located. A driver or the like for providing an electrical signal or power to the pixels PX may be located in the peripheral area PA. Pads 400 to which various electrical devices or a printed circuit board may be electrically connected may be located in the peripheral area PA. The pads 400 may be spaced apart from one another, and may be electrically connected to an external component such a printed circuit board or an integrated circuit device. Display apparatus 1 may be connected to the external component at the pads 400.

Figure 2:
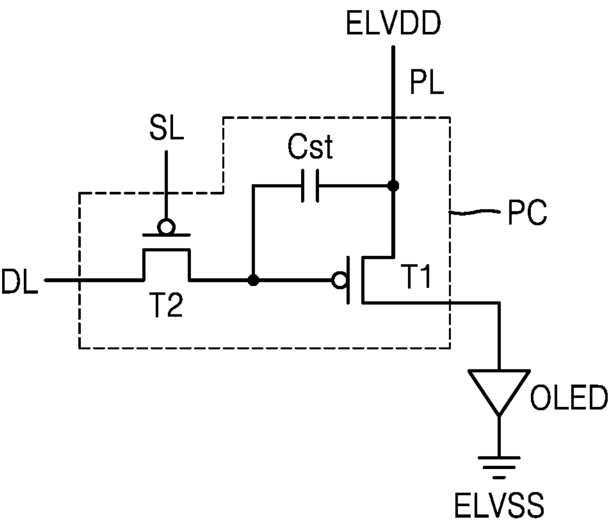
FIG. 2 is an equivalent circuit diagram illustrating an embodiment of a pixel included in the display apparatus of FIG. 1.

FIG. 2 is an equivalent circuit diagram illustrating a pixel PX included in the display apparatus 1 of FIG. 1. As shown in FIG. 2, one pixel PX may include a pixel circuit PC and an organic light-emitting device OLED as a light-emitting element which is electrically connected to the pixel circuit PC.

The pixel circuit PC may include a first transistor T1, a second transistor T2, and a storage capacitor Cst. The second transistor T2 that is a switching transistor may be connected to one or more signal lines such as a scan line SL and a data line DL, and may be turned on by a switching signal input from the scan line SL to transmit a data signal input from the data line DL to the first transistor T1. One end of the storage capacitor Cst may be electrically connected to the second transistor T2 and the other end of the storage capacitor Cst which is opposite to the one end, may be electrically connected to a driving voltage line PL. The storage capacitor Cst may store a voltage corresponding to a difference between a voltage received from the second transistor T2 and a driving power supply voltage ELVDD supplied to the driving voltage line PL.

The first transistor T1 that is a driving transistor may be connected to the driving voltage line PL and the storage capacitor Cst, and may control a magnitude of driving current (e.g., electrical driving current) flowing from the driving voltage line PL to the organic light-emitting device OLED in response to a value of the voltage stored in the storage capacitor Cst. The organic light-emitting device OLED may emit light having a certain luminance due to the driving current. A counter electrode 230 (see FIG. 5) of the organic light-emitting device OLED may receive an electrode power supply voltage ELVSS.

Although the pixel circuit PC includes two transistors and one storage capacitor in FIG. 2, the disclosure is not limited thereto. For example, the number of transistors or the number of storage capacitors may be changed in various ways according to a design of the pixel circuit PC.

Figure 3:
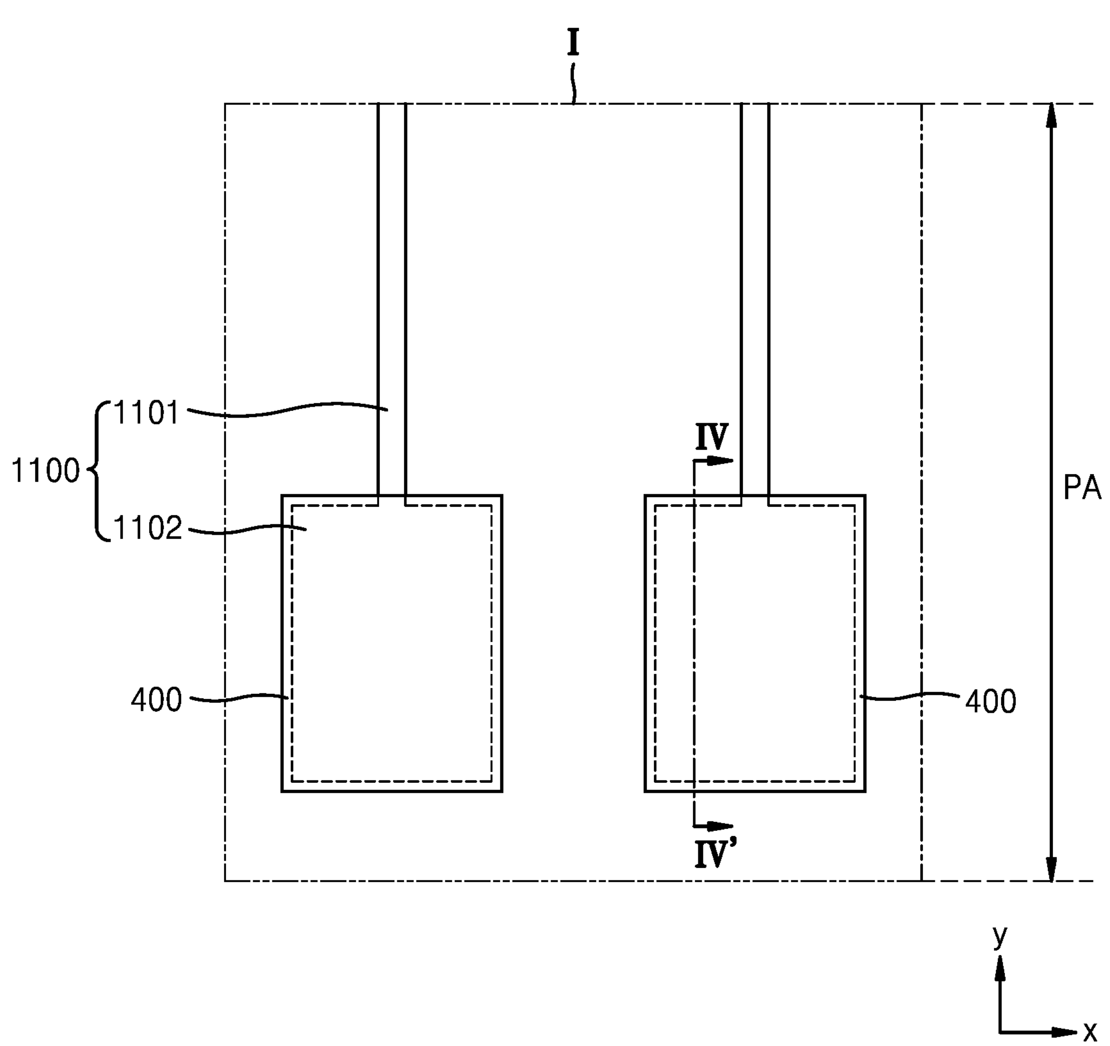
FIG. 3 is an enlarged plan view illustrating a portion I of FIG. 1.

FIG. 3 is an enlarged plan view illustrating a portion I of FIG. 1. As shown in FIG. 3, connection wirings 1100 may be located in the peripheral area PA. The connection wirings 1100 may electrically connect signal lines located in the display area DA, for example, data lines DL, to the pads 400. Each of the connection wirings 1100 may include a first portion 1101 extending in one direction and a second portion 1102 which is located at an end (e.g., a distal end) of the first portion 1101, to electrically connect a signal line to the pad 400.

The pad 400 may overlap (or correspond to) the connection wiring 1100. In detail, the pad 400 may be located over the second portion 1102 of the connection wiring 1100 to overlap the connection wiring 1100.

Figure 4:
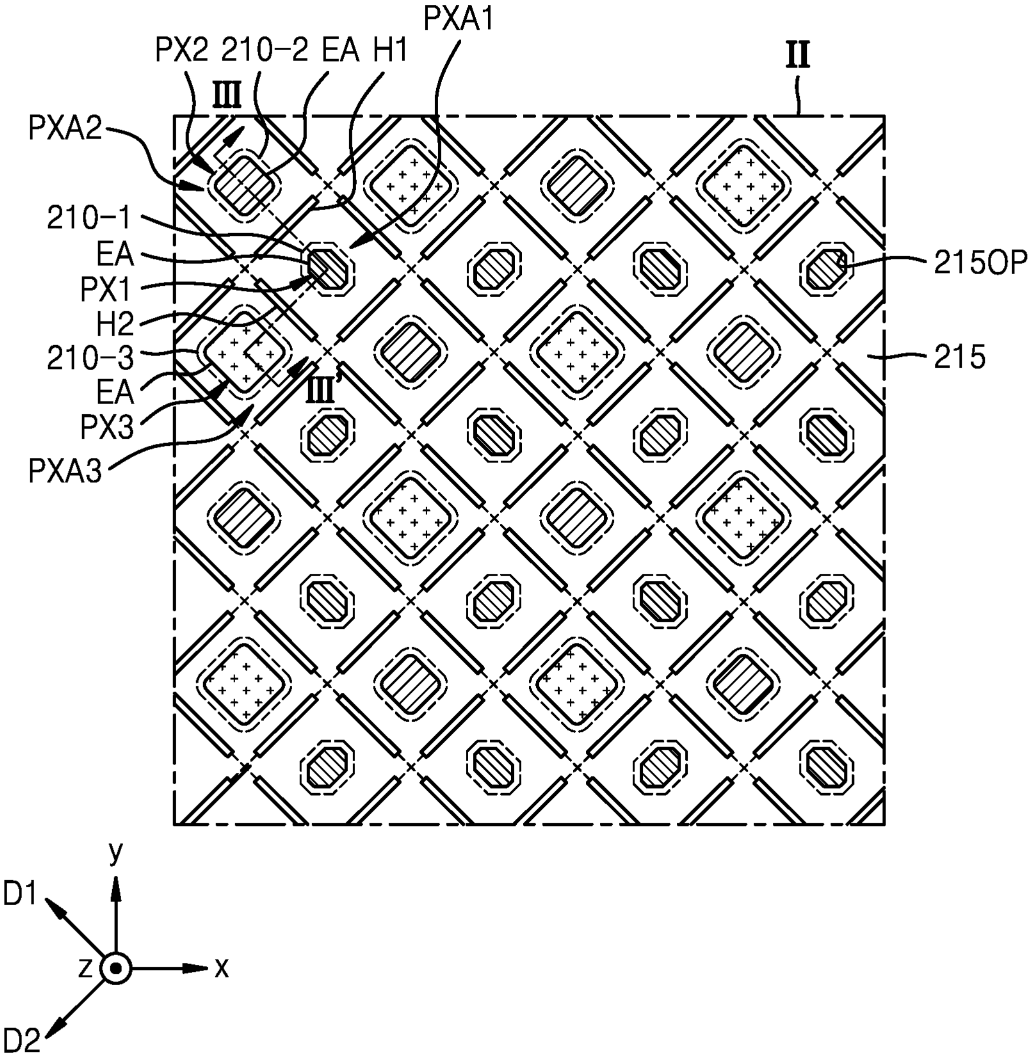
FIG. 4 is an enlarged plan view illustrating a portion II of FIG. 1.

FIG. 4 is an enlarged plan view illustrating a portion II of FIG. 1. FIG. 4 is a plan view illustrating a pixel-defining film 215 for convenience of explanation. As shown in FIG. 4, the display area DA of the substrate 100 may include a plurality of pixel areas, e.g., first through third pixel areas PXA1, PXA2, and PXA3, in which a plurality of pixels PX are located. Each of the pixels PX refers to a sub-pixel, and may include a display element such as an organic light-emitting device OLED. The pixel PX may emit, for example, green light, red light, or blue light. For example, the pixel PX may be a first pixel PX1 that emits green light, a second pixel PX2 that emits red light, or a third pixel PX3 that emits blue light. Green light may be light in a wavelength band of about 495 nanometers (nm) to about 580 nm, red light may be light in a wavelength band of about 580 nm to about 780 nm, and blue light may be light in a wavelength band of about 400 nm to about 495 nm.

A plurality of pixel electrodes, e.g., first through third pixel electrodes 210-1, 210-2, and 210-3, may be located in the display area DA, and may be spaced apart from one another in a plan view. For example, the first pixel electrode 210-1, the second pixel electrode 210-2, and the third pixel electrode 210-3 which are spaced apart from one another may be located in the display area DA.

The pixel-defining film 215 may include (or define) an opening 215OP through which a central portion of each of the plurality of pixel electrodes, e.g., the first through third pixel electrodes 210-1, 210-2, and 210-3, is exposed (e.g., exposed to outside the pixel-defining film 215). Although not shown in FIG. 4, emission layers of the display elements that emit light may be respectively located in the openings 215OP of the pixel-defining film 215. A counter electrode 230 of the display elements may be located on the emission layers and on the pixel-defining film 215. The counter electrode 230 may be integrally formed over the first through third pixel electrodes 210-1, 210-2, and 210-3.

A stacked structure of a respective one of the first through third pixel electrodes 210-1, 210-2, and 210-3, the emission layer, and the counter electrode 230 may together constitute one organic light-emitting device OLED. One opening 215OP of the pixel-defining film 215 may correspond to one organic light-emitting device OLED, and may define one emission area EA.

For example, an emission layer that emits green light may be located in the opening 215OP through which a central portion of the first pixel electrode 210-1 is exposed, and the first pixel PX1 may include the emission area EA defined by the opening 215OP. Likewise, an emission layer that emits red light may be located in the opening 215OP through which a central portion of the second pixel electrode 210-2 is exposed, and the second pixel PX2 may include the emission area EA defined by the opening 215OP. Likewise, an emission layer that emits blue light may be located in the opening 215OP through which a central portion of the third pixel electrode 210-3 is exposed, and the third pixel PX3 may include the emission area EA defined by the opening 215OP. However, the disclosure is not limited thereto. For example, an emission layer that emits blue light or green light may be located in the opening 215OP through which a central portion of the first pixel electrode 210-1 is exposed, the opening 215OP through which a central portion of the second pixel electrode 210-2 is exposed, and the opening 215OP through which a central portion of the third pixel electrode 210-3 is exposed, and the first pixel PX1, the second pixel PX2, and the third pixel PX3 may each include the emission area EA defined by the opening 215OP. In this case, the display apparatus 1 may include a light-emitting panel and a color panel stacked in (or along) a thickness direction (e.g., z direction), and blue light or green light emitted by an emission layer of the light-emitting panel may be converted into or transmitted as red light, green light, or blue light while passing through the color panel. As such, the color panel may be otherwise referred to as a color-conversion panel.

The first pixel PX1 may be located in the first pixel area PXA1, the second pixel PX2 may be located in the second pixel area PXA2, and the third pixel PX3 may be located in the third pixel area PXA3. The first pixel area PXA1 and the second pixel area PXA2 may be located adjacent to each other in a first direction D1 (e.g., between a −x direction and a +y direction), and the first pixel area PXA1 and the third pixel area PXA3 may be located adjacent to each other in a second direction D2 (e.g., between-x direction and −y direction) that intersects the first direction D1.

A first hole H1 or a second hole H2 may be located between the first pixel area PXA1, the second pixel area PXA2, and the third pixel area PXA3. The first hole H1 or the second hole H2 may be substantially a portion between the first pixel area PXA1, the second pixel area PXA2, and the third pixel area PXA3. The first hole H1 may be located between the first pixel area PXA1 and the second pixel area PXA2, and may extend in the second direction D2. The second hole H2 may be located between the first pixel area PXA1 and the third pixel area PXA3, and may extend in the first direction D1. A respective hole having a planar shape may extend in one or more directions in the plan view, such as in a direction corresponding to a major dimension of the planar shape, without being limited thereto.

Although each of the first hole H1 and the second hole H2 has a rectangular shape (e.g., a planar shape of a rectangle) in FIG. 4, the disclosure is not limited thereto. For example, the first hole H1 and/or the second hole H2 may have a polygonal shape including a quadrangular shape. That is, the first hole H1 and/or the second hole H2 May have a rectangular shape in which a horizontal length is greater than a vertical length, a rectangular shape in which a horizontal length is less than a vertical length, or a square shape. Alternatively, the first hole H1 and/or the second hole H2 may have any of various shapes such as an elliptical shape or a circular shape.

Although the plurality of pixels PX are arranged in an RGBG type (so-called PenTile® structure) in FIG. 4, the plurality of pixels PX may be arranged in any of various types such as a stripe type.

Figure 5:
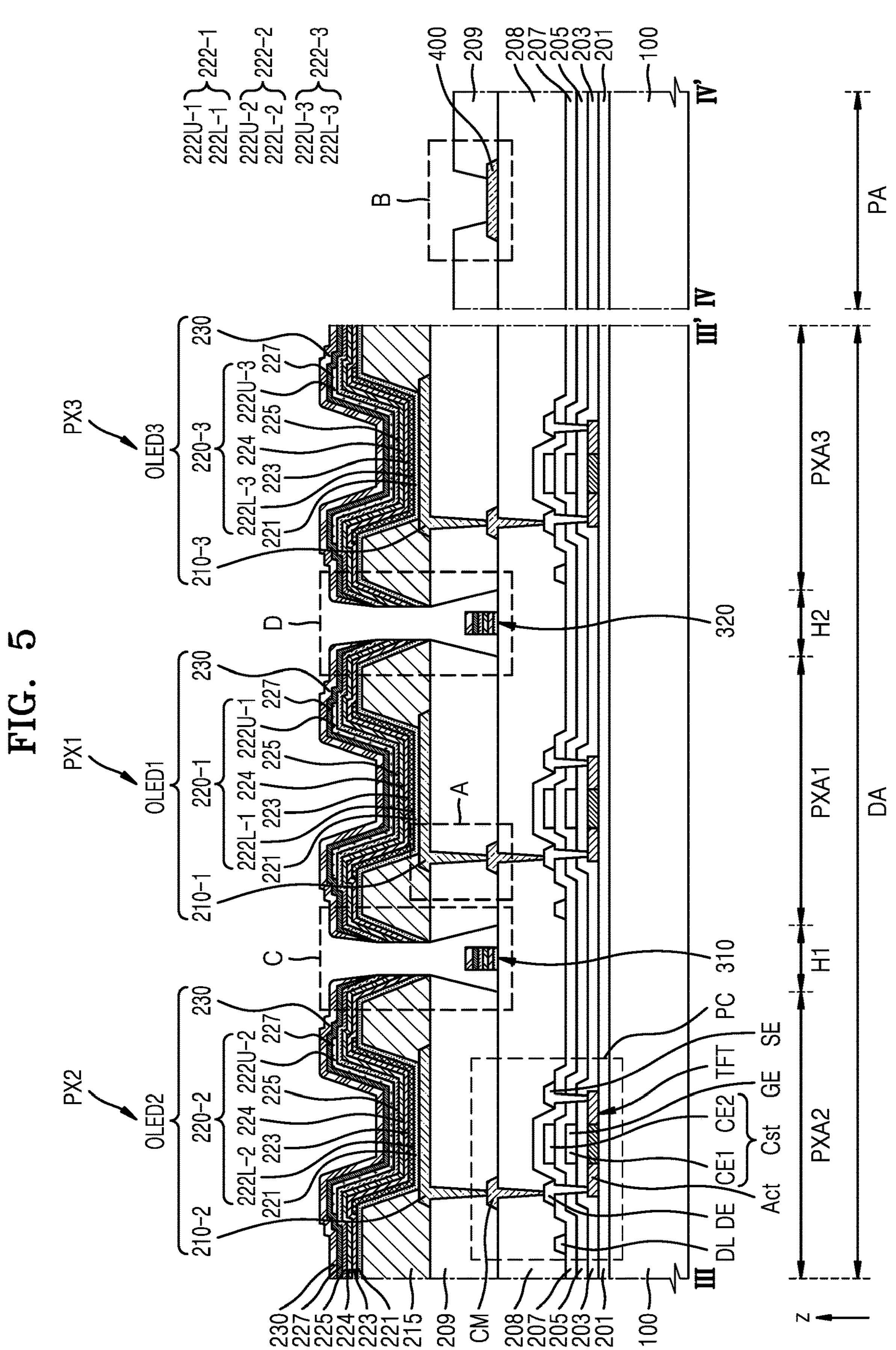
FIG. 5 is a cross-sectional view schematically illustrating a display apparatus, according to an embodiment.
Figure 6:
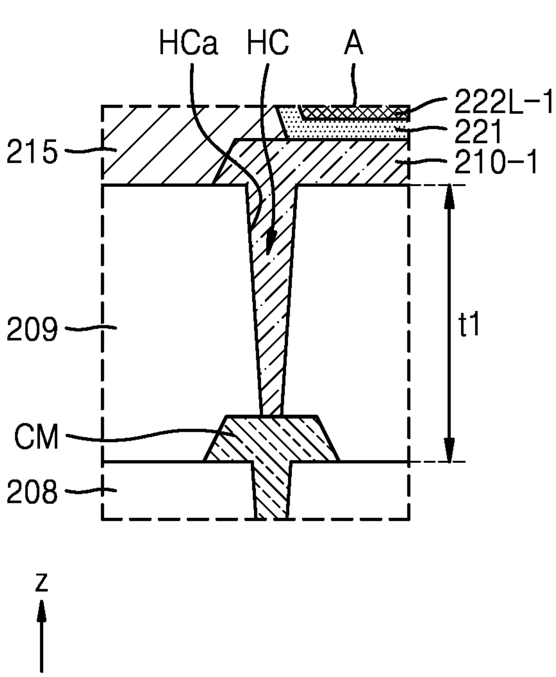
FIG. 6 is an enlarged cross-sectional view illustrating a portion A of FIG. 5.
Figure 7:
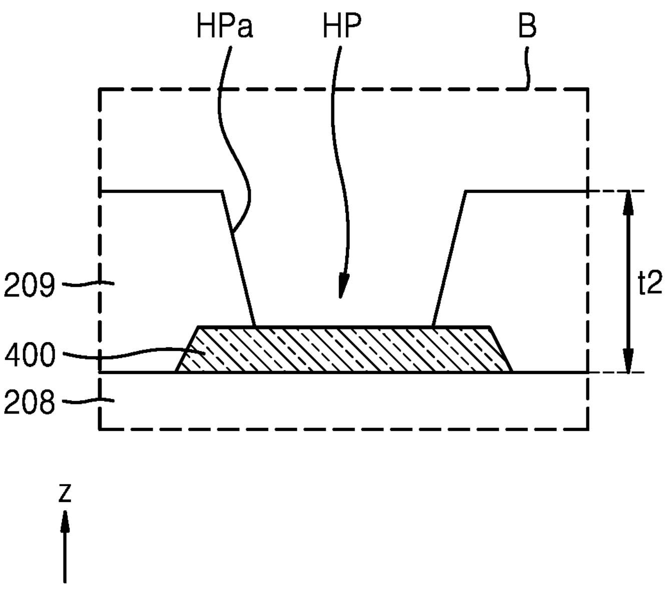
FIG. 7 is an enlarged cross-sectional view illustrating a portion B of FIG. 5.
Figure 8:
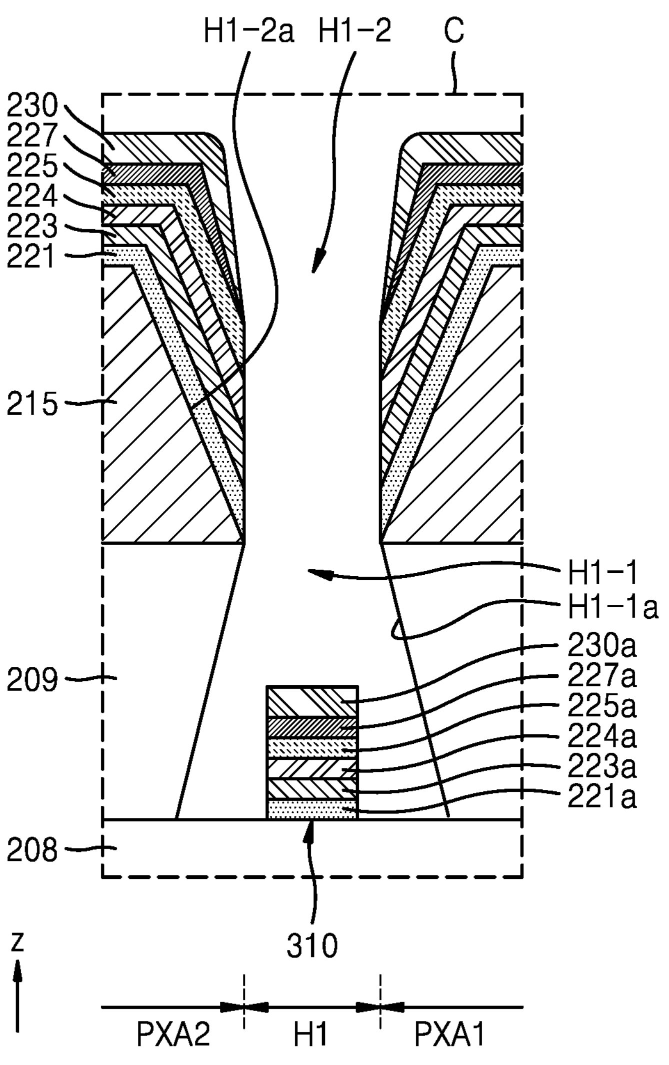
FIG. 8 is an enlarged cross-sectional view illustrating a portion C of FIG. 5.

FIG. 5 is a cross-sectional view schematically illustrating a part of the display apparatus 1, according to an embodiment. In detail, FIG. 5 is a cross-sectional view taken along line III-III' of FIG. 4 and line IV-IV' of FIG. 3. FIG. 6 is an enlarged cross-sectional view illustrating a portion A of FIG. 5. FIG. 7 is an enlarged cross-sectional view illustrating a portion B of FIG. 5. FIG. 8 is an enlarged cross-sectional view illustrating a portion C of FIG. 5.

As shown in FIG. 5, the display apparatus 1 according to the present embodiment includes the substrate 100. The substrate 100 may include any of various flexible or bendable materials. For example, the substrate 100 may include glass, a metal, or a polymer resin. Also, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the substrate 100 may have a multi-layer structure including two layers each including a polymer resin and a barrier layer including an inorganic material (e.g., silicon oxide, silicon nitride, or silicon oxynitride) and located between the two layers.

A display element, and a thin-film transistor TFT which is electrically connected to the display element may be located on the substrate 100. In FIG. 5, an organic light-emitting device OLED is located as a display element on the substrate 100. When the organic light-emitting device OLED is electrically connected to the thin-film transistor TFT, it may mean that a pixel electrode included in the organic light-emitting device OLED is electrically connected to the thin-film transistor TFT.

The pixel circuit PC may be located on the substrate 100. Structures of the pixel circuits PC of the pixels PX are the same, and thus, one pixel circuit PC will be mainly described.

The pixel circuit PC includes a plurality of thin-film transistors TFT and the storage capacitor Cst. Since one thin-film transistor TFT is illustrated in FIG. 5 for convenience of explanation, the thin-film transistor TFT may correspond to the driving thin-film transistor T1 (see FIG. 2).

A buffer layer 201 including an inorganic material such as silicon oxide, silicon nitride, and/or silicon oxynitride may be located between the thin-film transistor TFT and the substrate 100. The buffer layer 201 may also be located under the pad 400. The buffer layer 201 may increase smoothness of a top surface of the substrate 100, or may prevent or minimize penetration of impurities from the substrate 100 into a semiconductor layer Act of the thin-film transistor TFT.

As shown in FIG. 5, the thin-film transistor TFT includes the semiconductor layer Act including amorphous silicon, polysilicon, an organic semiconductor material, or an oxide semiconductor material. The thin-film transistor TFT may include a gate electrode GE, a source electrode SE, and/or a drain electrode DE. The gate electrode GE may include any of various conductive materials and may have any of various layer structures. For example, the gate electrode GE may include a molybdenum (Mo) layer and an aluminum (Al) layer. Alternatively, the gate electrode GE may include a TiNx layer, an Al layer, and/or a titanium (Ti) layer. Each of the source electrode SE and the drain electrode DE may also include any of various conductive materials and may have any of various layer structures. For example, each of the source electrode SE and the drain electrode DE may include a Ti layer, an Al layer, and/or a copper (Cu) layer.

In order to ensure insulation between the semiconductor layer Act and the gate electrode GE, a gate insulating layer 203 including an inorganic material such as silicon oxide, silicon nitride, and/or silicon oxynitride may be located between the semiconductor layer Act and the gate electrode GE. Although the gate insulating layer 203 has a shape corresponding to an entire surface of the substrate 100 and includes contact holes formed in pre-set portions in FIG. 5, the disclosure is not limited thereto. For example, the gate insulating layer 203 may be patterned to have the same shape (e.g., same planar shape) as that of the gate electrode GE.

A first interlayer insulating layer 205 including an inorganic material such as silicon oxide, silicon nitride, and/or silicon oxynitride may be located on the gate electrode GE. The first interlayer insulating layer 205 may have a single or multi-layer structure including the above material. An insulating film including an inorganic material may be formed by using chemical vapor deposition (CVD) or atomic layer deposition (ALD). This applies to the following embodiments and modifications thereof.

The storage capacitor Cst may include a first electrode CE1 and a second electrode CE2 overlapping each other with the first interlayer insulating layer 205 therebetween. The storage capacitor Cst may overlap the thin-film transistor TFT. In this regard, although the gate electrode GE of the thin-film transistor TFT is the first electrode CE1 of the storage capacitor Cst in FIG. 5, the disclosure is not limited thereto. For example, the storage capacitor Cst may not overlap the thin-film transistor TFT. The second electrode CE2 of the storage capacitor Cst may include a conductive material including molybdenum (Mo), aluminum (Al), copper (Cu), or titanium (Ti), and may have a single or multi-layer structure including the above material.

A second interlayer insulating layer 207 including an inorganic material such as silicon oxide, silicon nitride, and/or silicon oxynitride may be located on the second electrode CE2 of the storage capacitor Cst. The second interlayer insulating layer 207 may have a single or multi-layer structure including the above material.

Each of the source electrode SE and the drain electrode DE may be located on the second interlayer insulating layer 207. The data line DL, the source electrode SE, and the drain electrode DE may be located on the same layer and may include the same material. As being on a same layer and/or as including a same material, elements may be in a same layer as each other as respective portions of a same material layer, may be on a same layer by forming an interface with a same underlying or overlying layer, may be provided in a same process, etc. without being limited thereto. Each of the source electrode SE, the drain electrode DE, and the data line DL may include a material having high conductivity. Each of the source electrode SE and the drain electrode DE may include a conductive material including molybdenum (Mo), aluminum (Al), copper (Cu), or titanium (Ti), and may have a single or multi-layer structure including the above material. For example, each of the source electrode SE, the drain electrode DE, and the data line DL may have a multi-layer structure including Ti/Al/Ti.

However, the disclosure is not limited thereto. For example, the thin-film transistor TFT may include only one of the source electrode SE and the drain electrode DE, or may not include both the source electrode SE and the drain electrode DE. For example, one thin-film transistor TFT may not include the drain electrode DE, another thin-film transistor TFT connected to the thin-film transistor TFT may not include the source electrode SE, and the semiconductor layers Act of the two thin-film transistors may be connected to each other. This connection structure may have the same effect as that when one thin-film transistor TFT includes the source electrode SE, another thin-film transistor TFT includes the drain electrode DE, and the source electrode SE of the thin-film transistor TFT is connected to the drain electrode DE of the other thin-film transistor TFT.

As shown in FIG. 5, an organic insulating layer 208 may cover the thin-film transistor TFT and the storage capacitor Cst. The organic insulating layer 208 may include an organic insulating material. For example, the organic insulating layer 208 may include photoresist, benzocyclobutene (BCB), polyimide, hexamethyldisiloxane (HMDSO), polymethylmethacrylate (PMMA), polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. Although not shown in FIG. 5, a third interlayer insulating layer (not shown) may be further located under the organic insulating layer 208. The third interlayer insulating layer may include an inorganic insulating material such as silicon oxide, silicon nitride, or silicon oxynitride.

A connection metal layer CM may be located on the organic insulating layer 208, and a planarization layer 209 may cover the connection metal layer CM. The connection metal layer CM may include a conductive material including molybdenum (Mo), aluminum (Al), copper (Cu), or titanium (Ti), and may have a single or multi-layer structure including the above material. For example, the connection metal layer CM may have a multi-layer structure including Ti/Al/Ti. The connection metal layer CM may include a plurality of connection patterns arranged along the substrate 100.

The planarization layer 209 may provide a flat top surface for the organic light-emitting device OLED located on the planarization layer 209. The planarization layer 209 may include an organic insulating material. For example, the planarization layer 209 may include photoresist, BCB, polyimide, HMDSO, PMMA, polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The pad 400 may be located on the organic insulating layer 208, and the planarization layer 209 may cover the pad 400. The pad 400 may include the same material as that of the connection metal layer CM. In detail, the pad 400 may include a conductive material including molybdenum (Mo), aluminum (AI), copper (Cu), or titanium (Ti), and may have a single or multi-layer structure including the above material. For example, the pad 400 may have a multi-layer structure including Ti/Al/Ti. The planarization layer 209 may include a plurality of holes (e.g., HC, HP, H1-1, and H2-1). The plurality of holes will be described below in detail.

The organic light-emitting devices OLED may be located on the planarization layer 209, in the display area DA. In detail, a first organic light-emitting device OLED1 and a second organic light-emitting device OLED2 that are adjacent to each other in the first direction D1 may be located on the planarization layer 209, and a third organic light-emitting device OLED3 may be located on the planarization layer 209 to be adjacent to the first organic light-emitting device OLED1 in the second direction D2 that intersects the first direction D1. The first organic light-emitting device OLED1, the second organic light-emitting device OLED2, and the third organic light-emitting device OLED3 may emit light of different colors. For example, the first organic light-emitting device OLED1 may emit green light, the second organic light-emitting device OLED2 may emit red light, and the third organic light-emitting device OLED3 may emit blue light.

The first organic light-emitting device OLED1 may include the first pixel electrode 210-1, a first intermediate layer 220-1 including a first emission layer 222-1, and a counter electrode 230. The second organic light-emitting device OLED2 may include the second pixel electrode 210-2, a second intermediate layer 220-2 including a second emission layer 222-2, and the counter electrode 230. The third organic light-emitting device OLED3 may include the third pixel electrode 210-3, a third intermediate layer 220-3 including a third emission layer 222-3, and the counter electrode 230.

The first pixel electrode 210-1 may be located on the planarization layer 209. The second pixel electrode 210-2 may be located on the planarization layer 209 to be adjacent to the first pixel electrode 210-1 in the first direction D1, and the third pixel electrode 210-3 may be located on the planarization layer 209 to be adjacent to the first pixel electrode 210-1 in the second direction D2 that intersects the first direction D1. Each of the first pixel electrode 210-1, the second pixel electrode 210-2, and the third pixel electrode 210-3 includes a light-transmitting conductive layer formed of a light-transmitting conductive oxide such as indium tin oxide (ITO), $In_2O_3$, or indium zinc oxide (IZO), and a reflective layer formed of a metal such as aluminum (Al) or silver (Ag). For example, each of the first pixel electrode 210-1, the second pixel electrode 210-2, and the third pixel electrode 210-3 may have a three layer structure including ITO/Ag/ITO.

Each of the first pixel electrode 210-1, the second pixel electrode 210-2, and the third pixel electrode 210-3 may be electrically connected to a thin-film transistor TFT by contacting any one of the source electrode SE and the drain electrode DE through the connection metal layer CM as shown in FIG. 5. The connection metal layer CM may be located between the thin-film transistor TFT and a respective pixel electrode among the first through third pixel electrodes 210-1, 210-2, and 210-3. The connection metal layer CM may be connected to the thin-film transistor TFT through a contact hole formed in (or provided in) the organic insulating layer 208.

The pixel-defining film 215 may be located on the planarization layer 209. The pixel-defining film 215 defines a pixel PX by using the opening 215OP corresponding to each pixel PX, that is, the opening 215OP through which at least a central portion of each of the first through third pixel electrodes 210-1, 210-2, and 210-3 is exposed to outside the pixel-defining film 215. Also, as shown in FIG. 5, the pixel-defining film 215 prevents an arc (e.g., electrical arc) or the like from occurring at an edge of the first pixel electrode 210-1, the second pixel electrode 210-2, or the third pixel electrode 210-3, by increasing a distance between the edge of each of the first pixel electrode 210-1, the second pixel electrode 210-2, and the third pixel electrode 210-3 and the counter electrode 230 over the first through third pixel electrodes 210-1, 210-2, and 210-3. The pixel-defining film 215 may include an organic material such as polyimide or hexamethyldisiloxane (HMDSO).

The first intermediate layer 220-1 may be located on the first pixel electrode 210-1. The second intermediate layer 220-2 may be located on the second pixel electrode 210-2, and the third intermediate layer 220-3 may be located on the third pixel electrode 210-3. Each of the first intermediate layer 220-1, the second intermediate layer 220-2, and the third intermediate layer 220-3 may include a low molecular weight material or a high molecular weight material.

When each of the first intermediate layer 220-1, the second intermediate layer 220-2, and the third intermediate layer 220-3 includes a low molecular weight material, each of the first intermediate layer 220-1, the second intermediate layer 220-2, and the third intermediate layer 220-3 may have a single structure or a structure in which a hole injection layer (HIL), a hole transport layer (HTL), an emission layer (EML), an electron transport layer (ETL), and an electron injection layer (EIL) are stacked, and may be formed (or provided) by using vacuum deposition.

When each of the first intermediate layer 220-1, the second intermediate layer 220-2, and the third intermediate layer 220-3 includes a high molecular weight material, each of the first through third intermediate layers 220-1, 220-2, and 220-3 may have a structure including a hole transport layer (HTL) and an emission layer (EML). In this case, the hole transport layer may include poly(3,4-ethylenedioxythiophene) (PEDOT), and the first, second, and third emission layers 222-1, 222-2, and 222-3 may include a high molecular weight material such as a polyphenylene vinylene (PPV)-based material or a polyfluorene-based material.

Each of the first intermediate layer 220-1, the second intermediate layer 220-2, and the third intermediate layer 220-3 may be formed by using screen printing, inkjet printing, or laser-induced thermal imaging. The first intermediate layer 220-1, the second intermediate layer 220-2, and the third intermediate layer 220-3 may include an integrated layer over the first through third pixel electrodes 210-1, 210-2, and 210-3, or may include layers patterned to respectively correspond to the first through third pixel electrodes 210-1, 210-2, and 210-3. Structures of the first intermediate layer 220-1, the second intermediate layer 220-2, and the third intermediate layer 220-3 will be described below in detail.

The counter electrode 230 may be located in the display area DA to cover the display area DA. That is, the counter electrode 230 may be integrally formed with the first through third organic light-emitting devices OLED1, OLED2, and OLED3 to correspond to the first through third pixel electrodes 210-1, 210-2, and 210-3. For example, the counter electrode 230 may overlap all of the first pixel electrode 210-1, the second pixel electrode 210-2, and the third pixel electrode 210-3. The counter electrode 230 may cover not only the display area DA but also the peripheral area PA (see FIG. 1).

The counter electrode 230 may include a light-transmitting conductive layer formed of ITO, $In_2O_3$, or IZO, and may include a semi-transmissive film including a metal such as Al or Ag. For example, the counter electrode 230 may be a semi-transmissive film including magnesium (Mg) or Ag. Although not shown in FIG. 5, a capping layer (not shown) may be located on the counter electrode 230. For example, the capping layer may have a single or multi-layer structure including a material selected from among an organic material, an inorganic material, and a mixture thereof. An LiF layer may be located on the capping layer in an optional embodiment.

As described above, the planarization layer 209 may include or define a plurality of holes (e.g., HC, HP, H1-1, and H2-1). As shown in FIG. 6 that is an enlarged cross-sectional view illustrating the portion A of FIG. 5, the planarization layer 209 may include a contact hole HC. Each of the first through third pixel electrodes 210-1, 210-2, and 210-3 may be connected to the connection metal layer CM through or within the contact hole HC formed in the planarization layer 209. That is, each of the first through third pixel electrodes 210-1, 210-2, and 210-3 may be electrically connected to the thin-film transistor TFT, through the contact hole HC formed in the planarization layer 209, the connection metal layer CM and a contact hole formed in the organic insulating layer 208.

An inner surface HCa of the planarization layer 209 (e.g., a first inner surface) which defines the contact hole HC may include a forward-tapered inclined surface. When an inner surface of a layer which defines a hole includes a forward-tapered inclined surface, it means that a width of a portion of the hole in a direction (−z direction) close to the substrate 100 is less than a width of a portion of the hole in a direction (+z direction) far from the substrate 100. That is, a width of a respective hole (e.g., along a plane) decreases as a distance along the z direction to the substrate 100 decreases, while the width of the respective hole increases as a distance along the z direction from the substate 100 increases. In contrast, when an inner surface of a layer which defines a hole includes a reverse-tapered inclined surface, it means that a width of a portion of the hole in a direction (−z direction) close to the substrate 100 is greater than a width of a portion of the hole in a direction (+z direction) far from the substrate 100. That is, a width of a respective hole (e.g., along a plane) increases as a distance along the z direction to the substrate 100 decreases, while the width of the respective hole decreases as a distance along the z direction from the substate 100 increases.

Since the inner surface HCa of the layer which defines the contact hole HC includes a forward-tapered inclined surface, step coverage of the first through third pixel electrodes 210-1, 210-2, and 210-3 formed on the planarization layer 209 may be improved. That is, each of the first through third pixel electrodes 210-1, 210-2, and 210-3 formed on the planarization layer 209 may be accurately connected to the connection metal layer CM through the contact hole HC.

As shown in FIG. 7 that is an enlarged cross-sectional view illustrating the portion B of FIG. 5, the planarization layer 209 may include a pad hole HP. A top surface of the pad 400 may be exposed to the outside (e.g., to outside the planarization layer 209) through the pad hole HP. An inner surface HPa of the planarization layer 209 (e.g., a second inner surface) which defines the pad hole HP may include a forward-tapered inclined surface. When the inner surface HPa of the layer which defines the pad hole HP includes a reverse-tapered inclined surface, there may be moisture or the like between the pad 400 and the inner surface HPa of the pad hole HP. Accordingly, even when an electrical signal is to be applied only to a specific pad 400 from among the plurality of pads 400, the electrical signal may also be unintentionally applied to a pad 400 adjacent to the specific pad 400 through the moisture or the like between the pad 400 and the inner surface HPa of the layer which defines the pad hole HP. However, in the display apparatus 1 according to the present embodiment, since the inner surface HPa of the layer which defines the pad hole HP includes a forward-tapered inclined surface as shown in FIG. 7, moisture or the like may be absent or minimized between the pad 400 and the inner surface HPa of the layer which defines the pad hole HP.

The pad 400 exposed through the pad hole HP may be electrically connected to a driving chip (not shown) provided in the display apparatus 1 through an anisotropic conductive film or the like. The driving chip may be, for example, an integrated circuit (IC) chip, and may include a body and an output terminal and an input terminal located on both sides of the body. That is, the pad 400 may be electrically connected to the driving chip, by placing, pressing, and attaching the anisotropic conductive film between the pad 400 and the input terminal and/or the output terminal of the driving chip.

A thickness of a layer may be a maximum thickness at a location along the layer. A thickness t2 of the planarization layer 209 on (or corresponding to) the pad 400 may be different from a thickness t1 of the planarization layer 209 in the display area DA. In detail, the thickness t2 of the planarization layer 209 on the pad 400 may be less than the thickness t1 of the planarization layer 209 in the display area DA. When the thickness t2 of the planarization layer 209 on the pad 400 is large, sufficient pressure may not be applied to the output terminal and/or the input terminal of the driving chip, thereby failing to electrically connect the pad 400 to the driving chip. However, in the display apparatus 1 of the present embodiment, the thickness t2 of the planarization layer 209 on the pad 400 may be less than the thickness t1 of the planarization layer 209 in the display area DA. In this case, since sufficient pressure may be applied to the output terminal and/or the input terminal of the driving chip, the pad 400 may be stably connected to the driving chip. Accordingly, there may be no or minimized connection failure of the driving chip.

A stacked structure of the first through third intermediate layers 220-1, 220-2, and 220-3 of the first through third organic light-emitting devices OLED1, OLED2, and OLED3 will be described with reference to FIG. 5.

The first intermediate layer 220-1 may include a first common layer 221, the first emission layer 222-1, and a second common layer 227. The first emission layer 222-1 may include a high molecular weight organic material or a low molecular weight organic material that emits light of a certain color. That is, the first emission layer 222-1 may emit light of a certain wavelength band. The second emission layer 222-2 of the second organic light-emitting device OLED2 may emit light of a wavelength band different from that of the first emission layer 222-1 of the first organic light-emitting device OLED1. The third emission layer 222-3 of the third organic light-emitting device OLED3 may emit light of a wavelength band different from that of the second emission layer 222-2 of the second organic light-emitting device OLED2 and the first emission layer 222-1 of the first organic light-emitting device OLED1. For example, the first emission layer 222-1, the second emission layer 222-2, and the third emission layer 222-3 may respectively emit green light, red light, and blue light. Green light may be light in a wavelength band of about 495 nm to about 580 nm, red light may be light in a wavelength band of about 580 nm to about 780 nm, and blue light may be light in a wavelength band of about 400 nm to about 495 nm.

As shown in FIG. 5, the first organic light-emitting device OLED1 may have a tandem structure. In detail, the first organic light-emitting device OLED1 may include a first lower emission layer 222L-1 and a first upper emission layer 222U-1, and the first upper emission layer 222U-1 may be located on the first lower emission layer 222L-1 to overlap the first lower emission layer 222L-1. Likewise, the second organic light-emitting device OLED2 may include a second lower emission layer 222L-2 and a second upper emission layer 222U-2, and the second upper emission layer 222U-2 may be located on the second lower emission layer 222L-2 to overlap the second lower emission layer 222L-2. Likewise, the third organic light-emitting device OLED3 may include a third lower emission layer 222L-3 and a third upper emission layer 222U-3, and the third upper emission layer 222U-3 may be located on the third lower emission layer 222L-3 to overlap the third lower emission layer 222L-3. That is, the first emission layer 222-1 may include the first lower emission layer 222L-1 and the first upper emission layer 222U-1, the second emission layer 222-2 may include the second lower emission layer 222L-2 and the second upper emission layer 222U-2, and the third emission layer 222-3 may include the third lower emission layer 222L-3 and the third upper emission layer 222U-3.

The first common layer 221 may be located between the first pixel electrode 210-1 and the first lower emission layer 222L-1, between the second pixel electrode 210-2 and the second lower emission layer 222L-2, and between the third pixel electrode 210-3 and the third lower emission layer 222L-3. The first common layer 221 may have a single or multi-layer structure. For example, when the first common layer 221 is formed of a high molecular weight material, the first common layer 221 that is a hole transport layer (HTL) having a single-layer structure may be formed of poly-(3,4-ethylenedioxythiophene) (PEDOT), polyaniline (PANI), N,N'-diphenyl-N,N'-bis(3-methylphenyl)-1,1'-bi-phenyl-4,4'-diamine (TPD), or N,N'-di(naphthalen-1-yl)-N,N'-diphenyl-benzidine (NPB). When the first common layer 221 is formed of a low molecular weight material, the first common layer 221 may include a hole injection layer (HIL) and a hole transport layer (HTL).

The second common layer 227 may be located on the first upper emission layer 222U-1, the second upper emission layer 222U-2, and the third upper emission layer 222U-3. The second common layer 227 may not always be provided. For example, it is preferable that when each of the first common layer 221, the first emission layer 222-1, the second emission layer 222-2, and the third emission layer 222-3 is formed of a high molecular weight material, the second common layer 227 is formed. The second common layer 227 may have a single or multi-layer structure. The second common layer 227 may include an electron transport layer (ETL) and/or an electron injection layer (EIL). The counter electrode 230 may be located on the second common layer 227.

The first intermediate layer 220-1, the second intermediate layer 220-2, and the third intermediate layer 220-3 may further include a charge generation layer 224. The charge generation layer 224 may be located between the first lower emission layer 222L-1 and the first upper emission layer 222U-1, between the second lower emission layer 222L-2 and the second upper emission layer 222U-2, and between the third lower emission layer 222L-3 and the third upper emission layer 222U-3. The charge generation layer 224 may supply electric charges to a first stack including the first lower emission layer 222L-1, the second lower emission layer 222L-2, and the third lower emission layer 222L-3 and a second stack including the first upper emission layer 222U-1, the second upper emission layer 222U-2, and the third upper emission layer 222U-3.

The first intermediate layer 220-1, the second intermediate layer 220-2, and the third intermediate layer 220-3 may further include a third common layer 223 and a fourth common layer 225. The third common layer 223 may be located between the first lower emission layer 222L-1 and the charge generation layer 224, between the second lower emission layer 222L-2 and the charge generation layer 224, and between the third lower emission layer 222L-3 and the charge generation layer 224. The fourth common layer 225 may be located between the charge generation layer 224 and the first upper emission layer 222U-1, between the charge generation layer 224 and the second upper emission layer 222U-2, and between the charge generation layer 224 and the third upper emission layer 222U-3. The third common layer 223 may include an electron transport layer, and the fourth common layer 225 may include a hole transport layer.

For example, the first intermediate layer 220-1 may include the first common layer 221, the first lower emission layer 222L-1, the third common layer 223, the charge generation layer 224, the fourth common layer 225, the first upper emission layer 222U-1, and the second common layer 227. Likewise, the second intermediate layer 220-2 may include the first common layer 221, the second lower emission layer 222L-2, the third common layer 223, the charge generation layer 224, the fourth common layer 225, the second upper emission layer 222U-2, and the second common layer 227. Likewise, the third intermediate layer 220-3 may include the first common layer 221, the third lower emission layer 222L-3, the third common layer 223, the charge generation layer 224, the fourth common layer 225, the third upper emission layer 222U-3, and the second common layer 227.

As shown in FIG. 8 that is an enlarged cross-sectional view schematically illustrating the portion C of FIG. 5, the display apparatus 1 may include a first hole H1. In detail, the planarization layer 209 may include a 1-1$^{st}$ hole H1-1 located between the first pixel area PXA1 and the second pixel area PXA2, and the pixel-defining film 215 may include a 1-2$^{nd}$ hole H1-2 overlapping the 1-1$^{st}$ hole H1-1. The first hole H1 may include the 1-1$^{st}$ hole H1-1 and the 1-2$^{nd}$ hole H1-2 which overlaps (or is aligned with) the 1-1$^{st}$ hole H1-1. The organic insulating layer 208 may be exposed to outside the planarization layer 209, the pixel-defining film 215, the respective intermediate layers and the counter electrode 230.

An inner surface H1-2*a* (e.g., a fifth inner surface) of the 1-2$^{nd}$ hole H1-2 (e.g., the layer which defines the 1-2$^{nd}$ hole H1-2) may include a forward-tapered inclined surface. Since the first common layer 221, the third common layer 223, the charge generation layer 224, the fourth common layer 225, the second common layer 227, and the counter electrode 230 are integrally formed over the plurality of organic light-emitting devices OLED, the layers may cover a part of the 1-2$^{nd}$ hole H1-2 (e.g., the sidewall of the layer which defines the 1-2$^{nd}$ hole H1-2). In detail, the first common layer 221, the third common layer 223, the charge generation layer 224, the fourth common layer 225, the second common layer 227, and the counter electrode 230 may cover an inner surface H1-2*a* of the 1-2$^{nd}$ hole H1-2.

An inner surface H1-1*a* of the planarization layer 209 (e.g., a third inner surface) which defines the 1-1$^{st}$ hole H1-1 may include a reverse-tapered inclined surface. Accordingly, layers integrally formed over the first organic light-emitting device OLED1 and the second organic light-emitting device OLED2 from among layers located on the planarization layer 209, for example, the first common layer 221, the third common layer 223, the charge generation layer 224, the fourth common layer 225, the second common layer 227, and the counter electrode 230 may be disconnected or separated in or at the 1-1$^{st}$ hole H1-1.

In detail, although the first common layer 221, the third common layer 223, the charge generation layer 224, the fourth common layer 225, the second common layer 227, and the counter electrode 230 are located on the pixel-defining film 215 in the first pixel area PXA1 and the first common layer 221, the third common layer 223, the charge generation layer 224, the fourth common layer 225, the second common layer 227, and the counter electrode 230 are located on the pixel-defining film 215 in the second pixel area PXA2, portions of the first common layer 221, the third common layer 223, the charge generation layer 224, the fourth common layer 225, the second common layer 227, and the counter electrode 230 may be located on the organic insulating layer 208 and in the 1-1$^{st}$ hole H1-1. That is, although the first common layer 221, the third common layer 223, the charge generation layer 224, the fourth common layer 225, the second common layer 227, and the counter electrode 230 located in the first pixel area PXA1 are respectively connected to the first common layer 221, the third common layer 223, the charge generation layer 224, the fourth common layer 225, the second common layer 227, and the counter electrode 230 located in the second pixel area PXA2, the layers may be separated from each other in a portion of a boundary between the first pixel area PXA1 and the second pixel area PXA2, that is, in the 1-1$^{st}$ hole H1-1. Since the inner surface H1-1*a* of the 1-1$^{st}$ hole H1-1 includes a reverse-tapered inclined surface, the first common layer 221, the third common layer 223, the charge generation layer 224, the fourth common layer 225, the second common layer 227, and the counter electrode 230 may not cover or extend along the inner surface H1-1*a* of the 1-1$^{st}$ hole H1-1.

Layers located in the 1-1$^{st}$ hole H1-1 are referred to as a first residual layer 310 for convenience. Accordingly, the first residual layer 310 may include a 1-1$^{st}$ residual common layer 221*a*, a 1-3th residual common layer 223*a*, a first residual charge generation layer 224*a*, a 1-4th residual common layer 225*a*, a 1-2$^{nd}$ residual common layer 227*a*, and a first residual counter electrode 230*a* respectively corresponding to the first common layer 221, the third common layer 223, the charge generation layer 224, the fourth common layer 225, the second common layer 227, and the counter electrode 230. That is, the first residual layer 310 may include the same material as at least a part of a material included in the first through third intermediate layers 220-1, 220-2, and 220-3, and may include the same material as a material of the counter electrode 230. In an embodiment, an organic insulating layer 208 faces the pixel-defining film 215 with the planarization layer 209 therebetween and is exposed to outside the planarization layer 209 at the 1-1$^{st}$ hole H1-1, and the first residual layer 310 is located in the 1-1$^{st}$ hole H1-1 of the planarization layer 209. Both the intermediate layer and the counter electrode 230 are disconnected at the 1-1$^{st}$ hole H1-1 of the planarization layer 209, and the first residual layer 310 includes a disconnected portion of the intermediate layer together with a disconnected portion of the counter electrode 230. Since the inner surface H1-1*a* of the 1-1$^{st}$ hole H1-1 includes a reverse-tapered inclined surface, a width of the 1-1$^{st}$ hole H1-1 in a direction (−z direction) close to the substrate 100 is greater than a width of the 1-1$^{st}$ hole H1-1 in the opposite direction (+z direction), and thus the first residual layer 310 may not contact the inner surface H1-1*a* of the 1-1$^{st}$ hole H1-1.

Since there are layers that are integrally formed over the first organic light-emitting device OLED1 and the second organic light-emitting device OLED2, leakage current may flow between the first organic light-emitting device OLED1 and the second organic light-emitting device OLED2 through the layers. For example, even when current is to be supplied only to the first organic light-emitting device OLED1 that emits green light, the current may be supplied even to the adjacent second organic light-emitting device OLED2 through layers that are integrally formed over the first organic light-emitting device OLED1 and the second organic light-emitting device OLED2, for example, the first common layer 221, the second common layer 227, the charge generation layer 224, the third common layer 223, and/or the fourth common layer 225. As a result, since not only green light is emitted from the first organic light-emitting device OLED1 but also red light is emitted from the second organic light-emitting device OLED2, display quality such as color purity may be degraded.

However, in the display apparatus 1 according to the present embodiment, as described above, the planarization layer 209 may provide the 1-1$^{st}$ hole H1-1 located between the first pixel area PXA1 and the second pixel area PXA2, and the inner surface H1-1*a* of the planarization layer 209 at the 1-1$^{st}$ hole H1-1 may include a reverse-tapered inclined surface. Accordingly, although the first common layer 221, the third common layer 223, the charge generation layer 224, the fourth common layer 225, the second common layer 227, and the counter electrode 230 located in the first pixel area PXA1 are respectively connected to the first common layer 221, the third common layer 223, the charge generation layer 224, the fourth common layer 225, the second common layer 227, and the counter electrode 230 located in the second pixel area PXA2 at areas around the various holes (refer to FIG. 4), the layers may be separated from each other in a portion of a boundary between the first pixel area PXA1 and the second pixel area PXA2, that is, in the 1-1$^{st}$ hole H1-1.

Accordingly, even when layers located on the planarization layer 209 are integrally formed over the first organic light-emitting device OLED1 and the second organic light-emitting device OLED2, leakage current between the first organic light-emitting device OLED1 and the second organic light-emitting device OLED2 through the layers may be prevented or minimized. That is, even when layers located on the planarization layer 209 are integrally formed over the plurality of organic light-emitting devices OLED, leakage current between the organic light-emitting devices OLED through the layers may be prevented or minimized.

In order to prevent or minimize leakage current between the organic light-emitting devices OLED, a separator including a reverse-tapered inclined surface may be separately formed. In this case, an additional manufacturing process may be further required to form the separator. However, in the display apparatus 1 according to the present embodiment, since the planarization layer 209 includes the 1-1$^{st}$ hole H1-1 including the inner surface H1-1*a* that is reverse-tapered and a 2-1$^{st}$ hole H2-1 including an inner surface H2-1*a* of the planarization layer 209 (e.g., a fourth inner surface) that is reverse-tapered, and the pixel-defining film 215 includes the 1-2$^{nd}$ hole H1-2 and the 2-2$^{nd}$ hole H2-2 respectively corresponding to the 1-1$^{st}$ hole H1-1 and the 2-1$^{st}$ hole H2-1, an additional manufacturing process is not further required. Accordingly, in the display apparatus 1 according to the present embodiment, manufacturing costs may be maintained and leakage current between the organic light-emitting devices OLED may be prevented or minimized.

Since the organic light-emitting devices OLED may be easily damaged by external moisture or oxygen, an encapsulation layer (not shown) may cover and protect the organic light-emitting devices OLED. The encapsulation layer may include a first inorganic encapsulation layer, an organic encapsulation layer, and a second inorganic encapsulation layer, and may cover the display area DA and may extend to the outside of the display area DA. Since the display apparatus 1 according to the present embodiment includes the first and second holes H1 and H2, the counter electrode 230 may have a curvature, and thus, a surface area of the counter electrode 230 may increase. Since the encapsulation layer is located on the counter electrode 230, an adhesive force between the encapsulation layer and the counter electrode 230 may increase.

Figure 9:
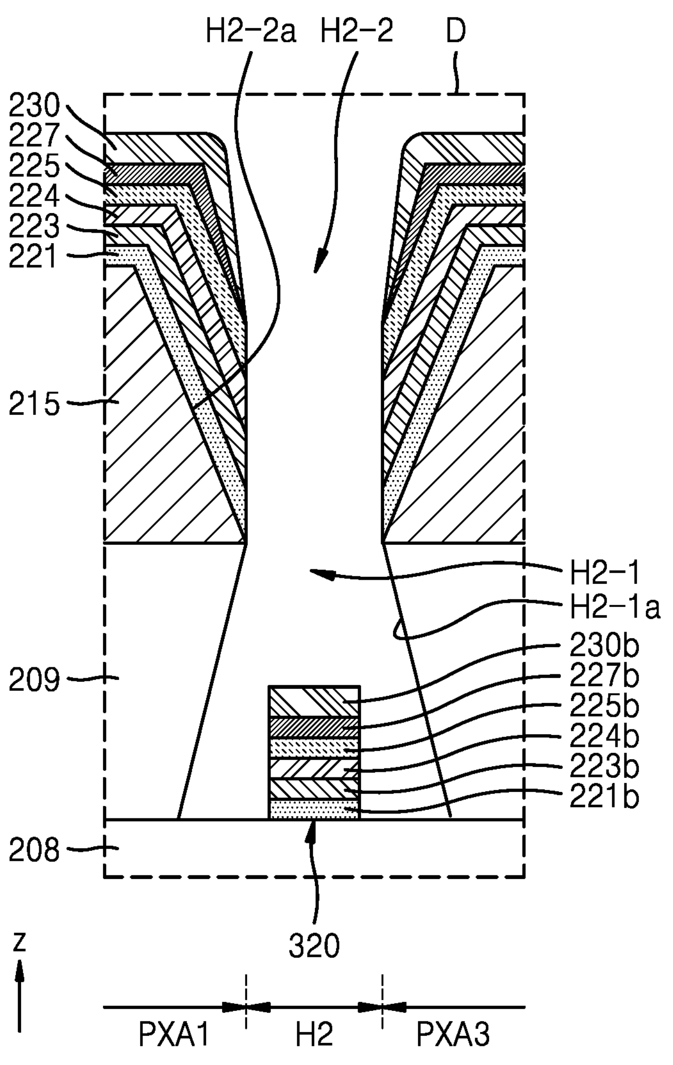
FIG. 9 is an enlarged cross-sectional view illustrating a portion D of FIG. 5.

As shown in FIG. 9 that is an enlarged cross-sectional view illustrating a portion D of FIG. 5, the display apparatus 1 may further include the second hole H2. In detail, the planarization layer 209 may include the 2-1$^{st}$ hole H2-1 located between the first pixel area PXA1 and the third pixel area PXA3, and the pixel-defining film 215 may include a 2-2$^{nd}$ hole H2-2 overlapping the 2-1$^{st}$ hole H2-1. The second hole H2 may include the 2-1$^{st}$ hole H2-1, and the 2-2$^{nd}$ hole H2-2 which overlaps the 2-1$^{st}$ hole H2-1. An inner surface H2-2*a* (e.g., a sixth inner surface) of the 2-2$^{nd}$ hole H2-2 may include a forward-tapered inclined surface, and the inner surface H2-1*a* of the 2-1$^{st}$ hole H2-1 may include a reverse-tapered inclined surface. A second residual layer 320 may be located in the 2-1$^{st}$ hole H2-1, and the second residual layer 320 may include a 2-1$^{st}$ residual common layer 221*b*, a 2-3th residual common layer 223*b*, a second residual charge generation layer 224*b*, a 2-4th residual common layer 225*b*, a 2-2$^{nd}$ residual common layer 227*b*, and a second residual counter electrode 230*b* respectively corresponding to the first common layer 221, the third common layer 223, the charge generation layer 224, the fourth common layer 225, the second common layer 227, and the counter electrode 230. The description of the first hole H1 and the first residual layer 310 may apply to the second hole H2 and the second residual layer 320, and thus, a repeated description will be omitted.

In the display apparatus 1 according to the present embodiment, as described above, the planarization layer 209 may include the 2-1$^{st}$ hole H2-1 located between the first pixel area PXA1 and the third pixel area PXA3 and the inner surface H2-1*a* of the 2-1$^{st}$ hole H2-1 may include a reverse-tapered inclined surface. Accordingly, although the first common layer 221, the third common layer 223, the charge generation layer 224, the fourth common layer 225, the second common layer 227, and the counter electrode 230 located in the first pixel area PXA1 are respectively connected to the first common layer 221, the third common layer 223, the charge generation layer 224, the fourth common layer 225, the second common layer 227, and the counter electrode 230 located in the third pixel area PXA3, at areas around the various holes (refer to FIG. 4), the layers may be separated from each other in a portion of a boundary between the first pixel area PXA1 and the third pixel area PXA3, that is, in the 2-1$^{st}$ hole H2-1.

Accordingly, even when layers located on the planarization layer 209 are integrally formed over the first organic light-emitting device OLED1 and the third organic light-emitting device OLED3, leakage current between the first organic light-emitting device OLED1 and the third organic light-emitting device OLED3 through the layers may be prevented or minimized. That is, even when layers located on the planarization layer 209 are integrally formed over the plurality of organic light-emitting devices OLED, leakage current between the organic light-emitting devices OLED through the layers may be prevented or minimized.

Figure 10:
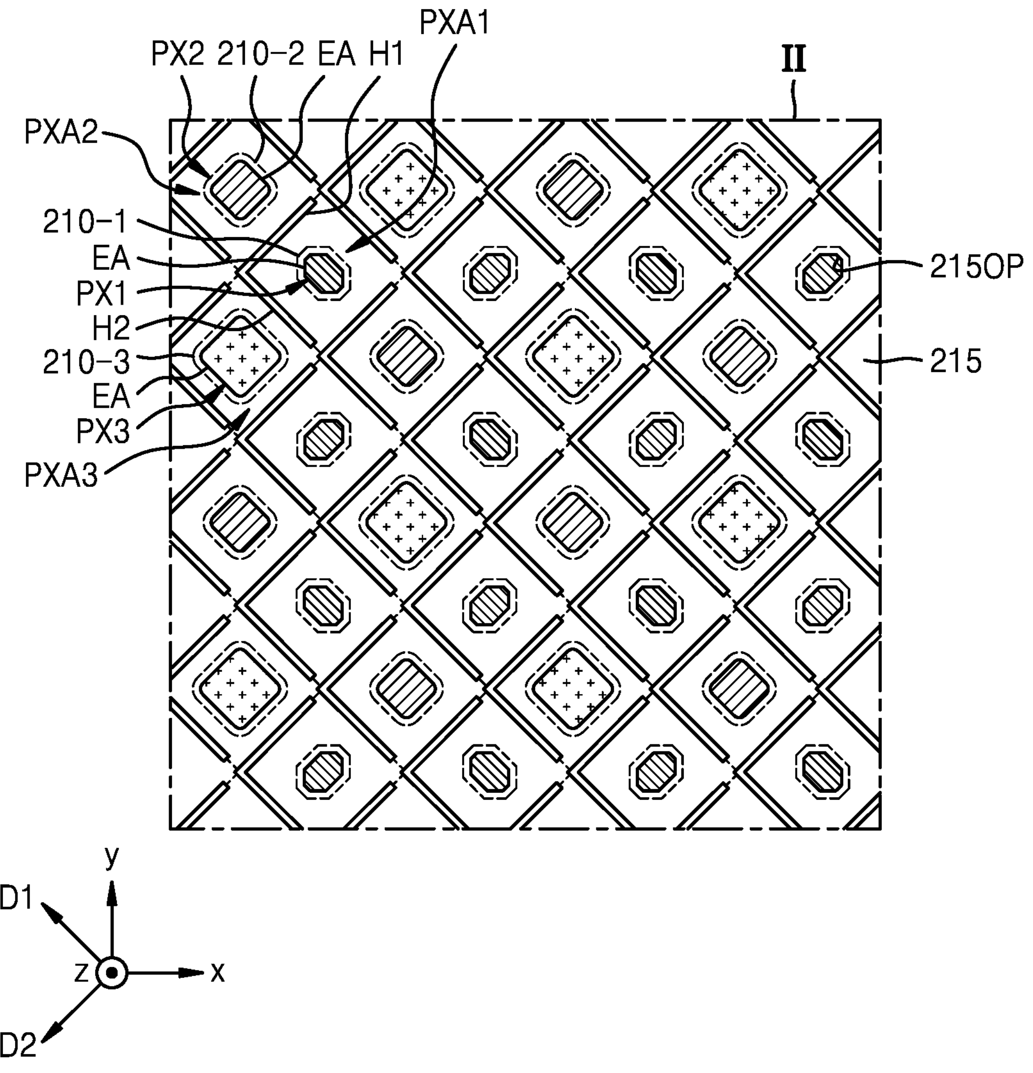
FIG. 10 is a plan view schematically illustrating a display apparatus, according to an embodiment.

Although the first hole H1 and the second hole H2 are spaced apart from each other in FIG. 4, the disclosure is not limited thereto. For example, as shown in FIG. 10 that is a plan view schematically illustrating a part of the display apparatus 1 according to an embodiment, the first hole H1 and the second hole H2 may be connected to each other. That is, the 1-1$^{st}$ hole H1-1 of the first hole H1 may be connected to the 2-1$^{st}$ hole H2-1 of the second hole H2, and the 1-2$^{nd}$ hole H1-2 of the first hole H1 may be connected to the 2-2$^{nd}$ hole H2-2 of the second hole H2.

Although the display apparatus 1 has been described, the disclosure is not limited thereto. A method of manufacturing (or providing) the display apparatus 1 will be described.

FIGS. 11 through 15 are cross-sectional views schematically illustrating a process of providing the display apparatus 1 of FIG. 1. In detail, FIGS. 11 through 15 are cross-sectional views schematically illustrating a process of forming (or providing) the planarization layer 209 and the pixel-defining film 215 of the display apparatus 1 of FIG. 1.

Figure 11:
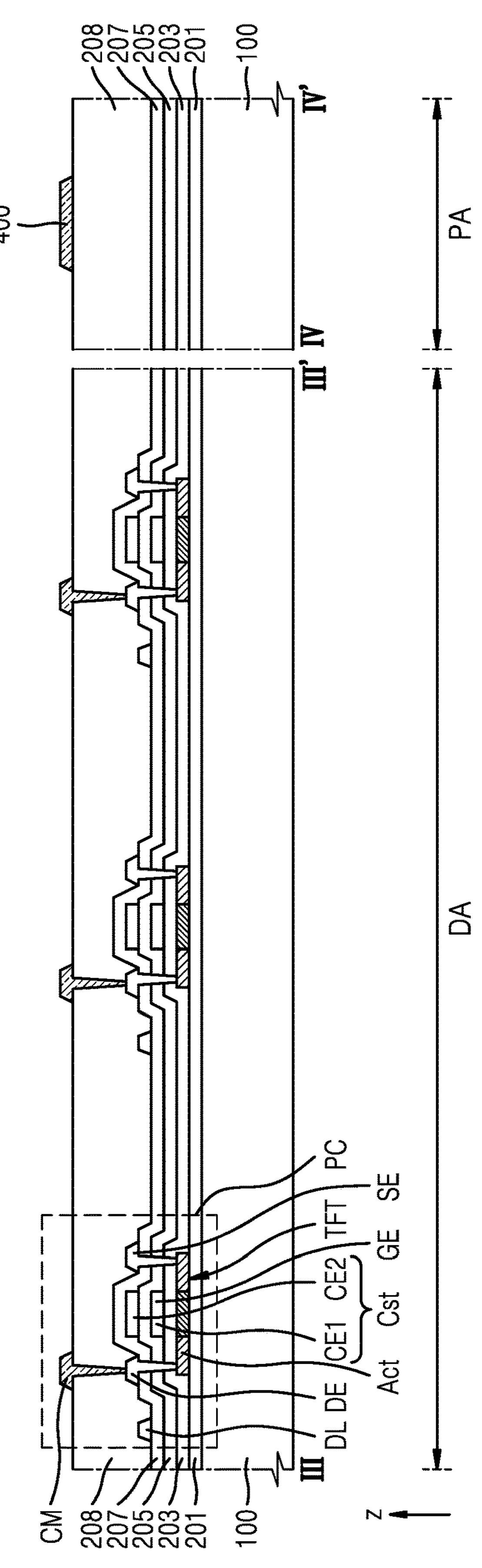

First, as shown in FIG. 11, the connection metal layer CM and the pad 400 may be formed on the substrate 100. In detail, the connection metal layer CM and the pad 400 may be formed by depositing a connection metal layer forming material on an entire surface of the substrate 100 by using a sputtering method or the like, and then patterning it into a shape of the connection metal layer CM and a shape of the pad 400. That is, the connection metal layer CM and the pad 400 are respective patterns of a same material layer, and may be considered in a same layer as each other, among layers on the substrate 100. The connection metal layer forming material may include a conductive material including molybdenum (Mo), aluminum (Al), copper (Cu), or titanium (Ti).

Figure 12:
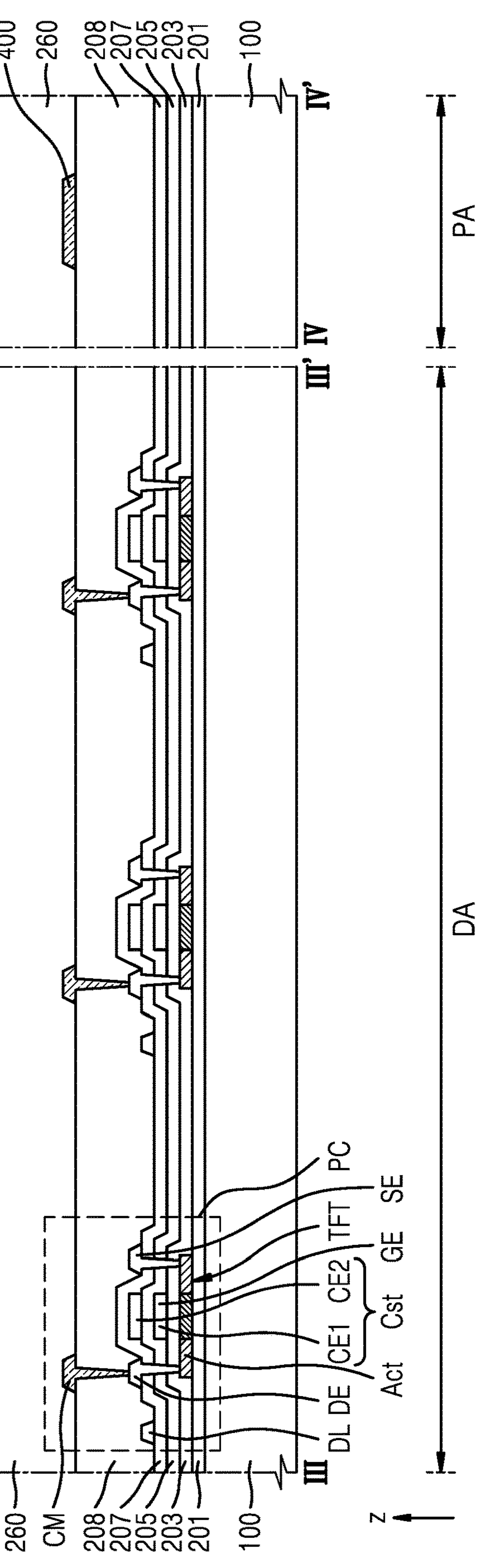

Next, as shown in FIG. 12, a planarization layer forming layer 260 may be formed to cover the connection metal layer CM and the pad 400. The planarization layer forming layer 260 in the specification refers to a layer in a state where a planarization layer forming material is applied but is not yet patterned into a shape of the planarization layer 209 (e.g., a preliminary planarization layer). In detail, the planarization layer forming layer 260 may be formed to cover the connection metal layer CM and the pad 400 by applying a negative photoresist to an entire surface of the substrate 100. A photoresist may be classified into a positive photoresist and a negative photoresist. A positive photoresist refers to a photoresist whose solubility in a developer is increased by exposure, and the negative photoresist refers to a photoresist whose solubility in a developer is decreased by exposure. Accordingly, when a partially exposed positive photoresist is developed, a pattern in which an exposed portion is removed may be generated, and when a partially exposed negative photoresist is developed, a pattern in which an unexposed portion is removed may be generated.

Figure 13:
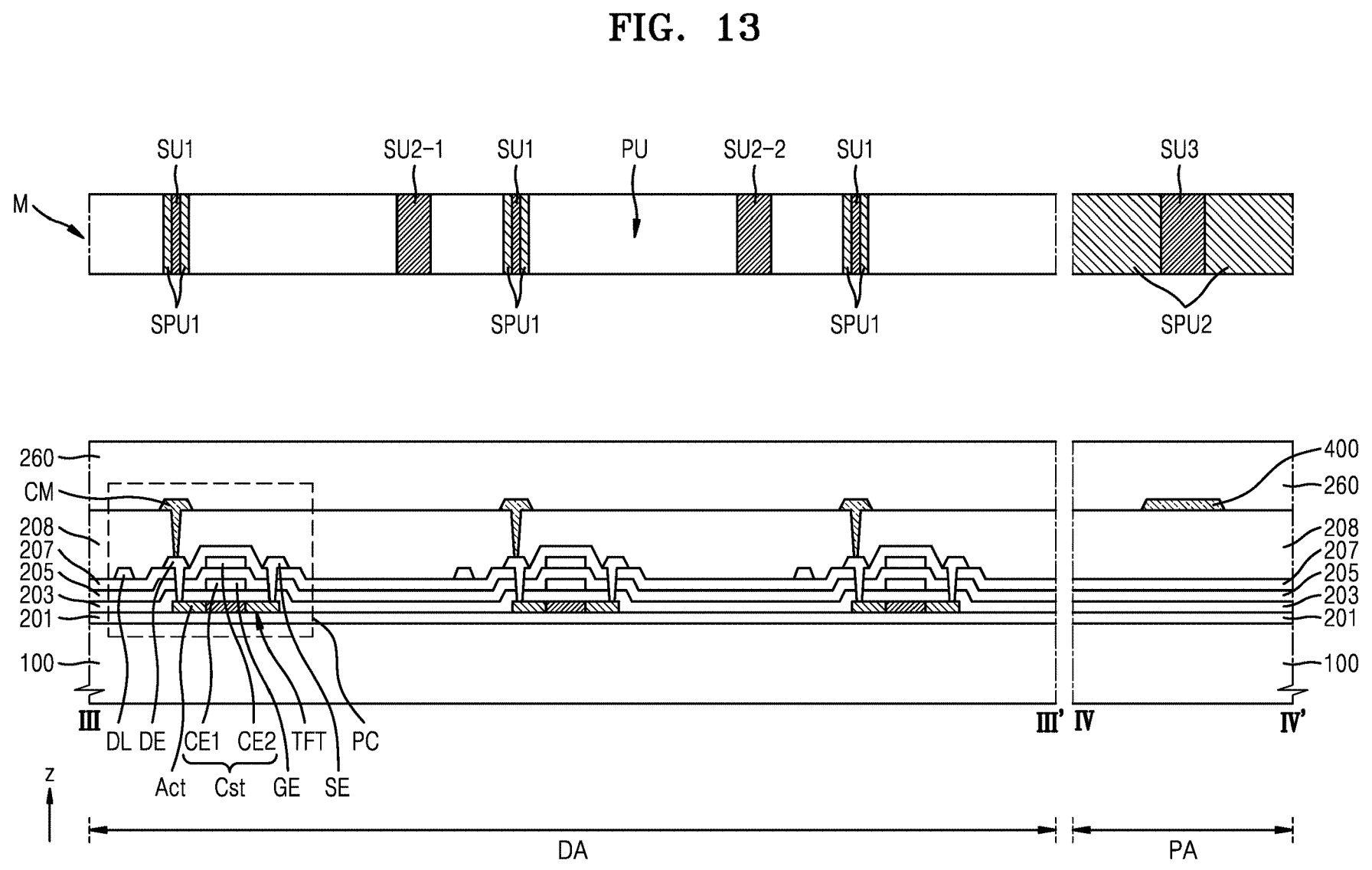

Next, as shown in FIG. 13, a halftone mask M may be placed on the planarization layer forming layer 260. The halftone mask M may include a first shielding portion SU1, a first semi-transmitting portion SPU1 surrounding the first shielding portion SU1, a 2-1$^{st}$ shielding portion SU2-1 (e.g., first sub-portion), a 2-2$^{nd}$ shielding portion SU2-2 (e.g., second sub-portion), a third shielding portion SU3, a second semi-transmitting portion SPU2 surrounding the third shielding portion SU3, and a transmitting portion PU. The 2-1$^{st}$ shielding portion SU2-1 may be spaced apart from the first shielding portion SU1 and the first semi-transmitting portion SPU1 in the first direction D1, and the 2-2$^{nd}$ shielding portion SU2-2 may be spaced apart from the first shielding portion SU1 and the first semi-transmitting portion SPU1 in the second direction D2 that intersects the first direction D1. A portion of the mask surrounding another portion of the mask, may form an interface between the two portions, without being limited thereto. For example, the first semi-transmitting portion SPU1 which surrounds the first shielding portion SU1 may be directly adjacent to the first shielding portion SU1.

In detail, the first shielding portion SU1 together with the first semi-transmitting portion SPU1 may be located on or corresponding to the connection metal layer CM, the 2-1$^{st}$ shielding portion SU2-1 may be spaced apart from the connection metal layer CM in the first direction D1, the 2-2$^{nd}$ shielding portion SU2-2 may be spaced apart from the connection metal layer CM in the second direction D2 that intersects the first direction D1, and the third shielding portion SU3 together with the second semi-transmitting portion SPU2 which surrounds the third shielding portion SU3 may be located on or corresponding to the pad 400.

Figure 14:
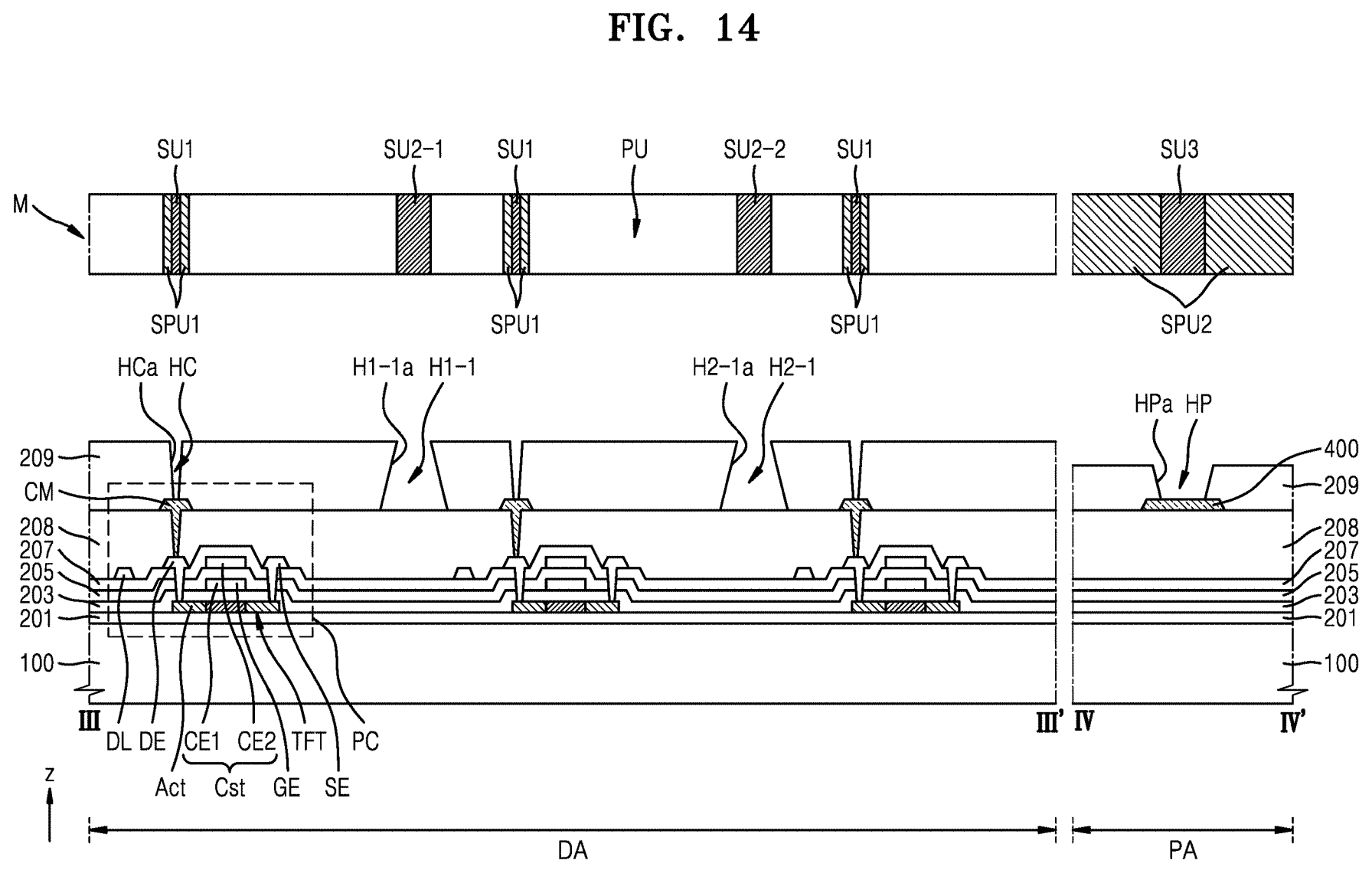

After the halftone mask M is placed facing the planarization layer forming layer 260, an exposure process of irradiating light such as ultraviolet rays to the planarization layer forming layer 260 through the halftone mask M may be performed. After the exposure process of the planarization layer forming layer 260, a development process of removing a pre-set portion of the planarization layer forming layer 260 may be performed, to form the planarization layer 209 having a specific pattern. That is, as shown in FIG. 14, the contact hole HC whose inner surface HCa includes a forward-tapered inclined surface defined by a sidewall of the planarization layer 209, may be formed in a portion of the planarization layer 209 located under the first shielding portion SU1 and the first semi-transmitting portion SPU1, and the 1-1$^{st}$ hole H1-1 whose inner surface H1-1*a* includes a reverse-tapered inclined surface defined by a sidewall of the planarization layer 209, may be formed in a portion of the planarization layer 209 located under the 2-1$^{st}$ shielding portion SU2-1. The 2-1$^{st}$ hole H2-1 whose inner surface H2-1*a* includes a reverse-tapered inclined surface defined by a sidewall of the planarization layer 209, may be formed in a portion of the planarization layer 209 located under the 2-2$^{nd}$ shielding portion SU2-2, and the pad hole HP whose inner surface HPa includes a forward-tapered inclined surface may be formed in a portion of the planarization layer 209 located under the third shielding portion SU3 and the second semi-transmitting portion SPU2. Each of the connection metal layer CM and the pad 400 are exposed to outside the planarization layer 209 at respective holes defined by the planarization layer 209.

Figure 16:
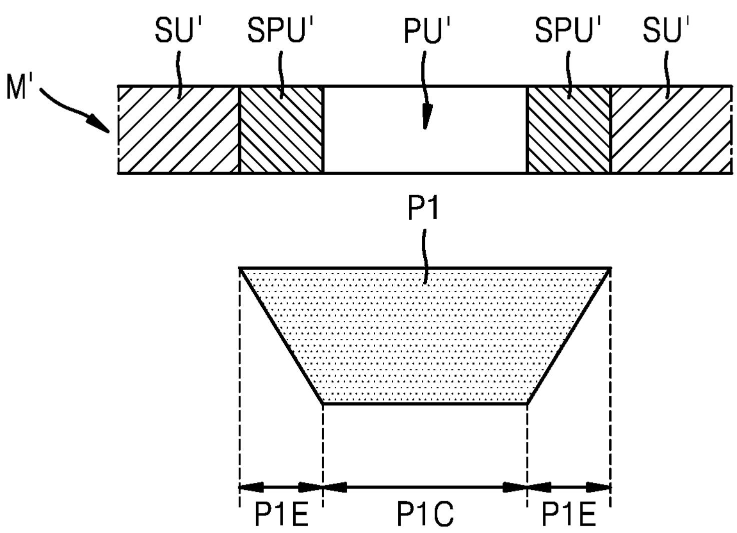
FIGS. 16 through 18 are views for describing a taper angle of a negative photoresist.
Figure 17:
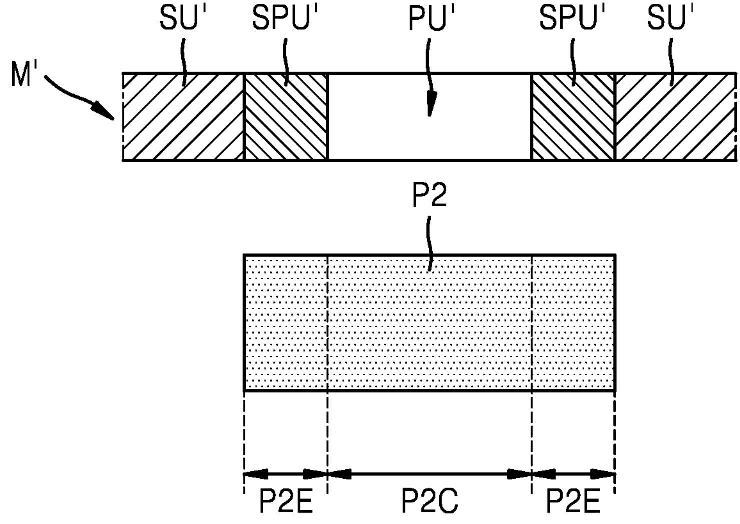
Figure 18:
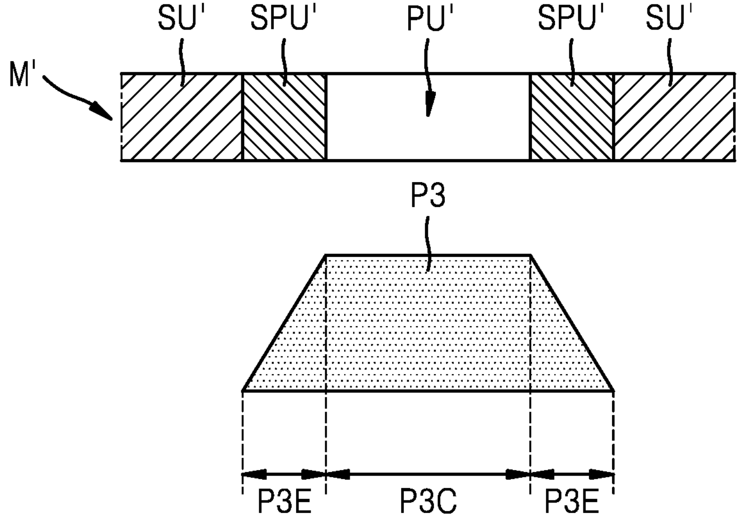

As shown in FIGS. 16 through 18 that are views for describing a taper angle of a negative photoresist, a taper direction of the negative photoresist may vary according to the amount of exposure. FIGS. 16 through 18 illustrate a halftone mask M' for convenience. The halftone mask M' may include a shielding portion SU', a semi-transmitting portion SPU', and a transmitting portion PU'. Negative photoresist patterns P1, P2, and P3 of FIGS. 16 through 18 may be formed by using the halftone mask M', and during exposure, the transmitting portion PU' of the halftone mask M' may be located on portions corresponding to central portions P1C, P2C, and P3C of the patterns during exposure, and the semi-transmitting portion SPU' of the halftone mask M' may be located on portions corresponding to edges P1E, P2E, and P3E of the patterns. The shielding portion SU' of the halftone mask M' may be located on portions corresponding to outside of (or adjacent to) the edges P1E, P2E, and P3E of the patterns.

In the negative photoresist pattern P1 of FIG. 16, during exposure using the halftone mask M', the central portion P1C of the pattern was irradiated with light at 80 millijoules (mJ), and the edge P1E of the pattern was irradiated with light at 16 mJ. In the negative photoresist pattern P2 of FIG. 17, during exposure using the halftone mask M', the central portion P2C of the pattern was irradiated with light at 60 mJ and the edge P2E of the pattern was irradiated with light at 12 mJ. In the negative photoresist pattern P3 of FIG. 18, during exposure using the halftone mask M', the central portion P3C of the pattern was irradiated with light at 40 mJ and the edge P3E of the pattern was irradiated with light at 8 mJ.

A negative photoresist is cured by exposure, and thus, the solubility of an exposed portion in a developer decreases. During exposure using a halftone mask M', when a sufficient amount of light to completely photo-cure a negative photoresist is irradiated, not only a portion located under a transmitting portion PU' but also a portion adjacent to a lower portion of the transmitting portion PU' may be exposed. Accordingly, the solubility of the portion adjacent to the lower portion of the transmitting portion PU' in a developer may decrease. Accordingly, like the negative photoresist pattern P1 of FIG. 16, a pattern including a reverse-tapered inclined surface may be formed.

When an insufficient amount of light to completely photo-cure a negative photoresist is irradiated, even an exposed portion may be dissolved in a developer. Accordingly, like the negative photoresist pattern P2 of FIG. 17, a pattern in which an inclination angle of the edge P2E is substantially 90° may be formed. Furthermore, when the amount of light irradiated to a negative photoresist is less than that when the negative photoresist pattern P2 of FIG. 17 is formed, like the negative photoresist pattern P3 of FIG. 18, a pattern including a forward-tapered inclined surface may be formed.

As such, a taper angle and a taper direction of a negative photoresist may vary according to the amount of exposure. Since a sufficient amount of light for photo-curing is irradiated to a portion of the planarization layer 209 under the 2-1$^{st}$ shielding portion SU2-1 or the 2-2$^{nd}$ shielding portion SU2-2 through the 2-1$^{st}$ shielding portion SU2-1 and the 2-2$^{nd}$ shielding portion SU2-2 of the halftone mask M, the planarization layer 209 may include the 1-1$^{st}$ hole H1-1 whose inner surface H1-1*a* includes a reverse-tapered inclined surface and the 2-1$^{st}$ hole H2-1 whose inner surface H2-1*a* includes a reverse-tapered inclined surface. The amount of light irradiated to the planarization layer 209 may be controlled by using the first semi-transmitting portion SPU1 and the second semi-transmitting portion SPU2 of the halftone mask M. Accordingly, the planarization layer 209 may include the contact hole HC whose inner surface HCa includes a forward-tapered inclined surface and the pad hole HP whose inner surface HPa includes a forward-tapered inclined surface. Furthermore, since a part of the planarization layer 209 located on the pad 400 may be removed by controlling the amount of light irradiated to the planarization layer 209 by using the second semi-transmitting portion SPU2, the planarization layer 209 may be formed so that the thickness t2 of the planarization layer 209 located on the pad 400 is less than the thickness t1 of the planarization layer 209 located in the display area DA.

In an embodiment, within the halftone mask M, the 2-1$^{st}$ shielding portion SU2-1 and the 2-2$^{nd}$ shielding portion SU2-2 of the halftone mask M may be connected to each other. Accordingly, the reverse-tapered 1-1$^{st}$ hole H1-1 and the reverse-tapered 2-1$^{st}$ hole H2-1 may also be connected to each other (refer to FIG. 10).

Figure 15:
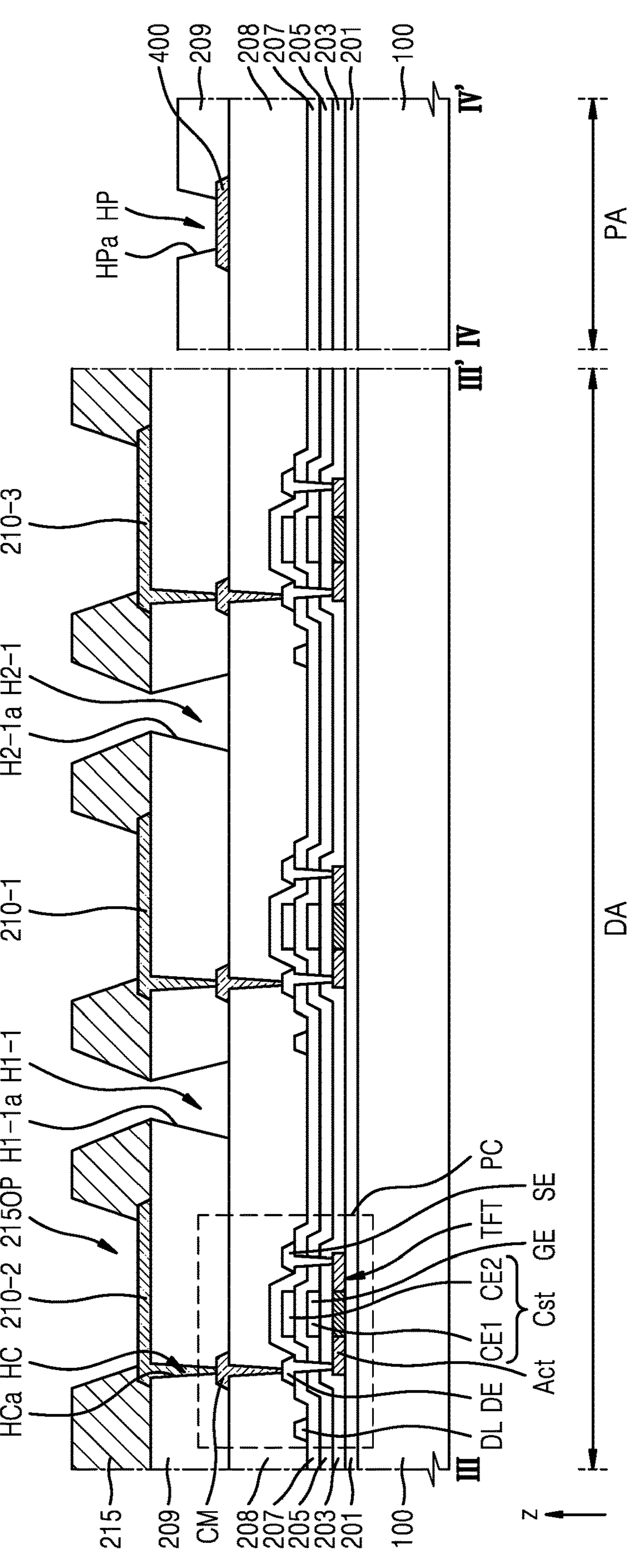

Next, as shown in FIG. 15, after the first through third pixel electrodes 210-1, 210-2, and 210-3 are formed on the planarization layer 209, the pixel-defining film 215 including the 1-2$^{nd}$ hole H1-2 overlapping the 1-1$^{st}$ hole H1-1 and the 2-2$^{nd}$ hole H2-2 overlapping the 2-1$^{st}$ hole H2-1 may be formed. In detail, since a positive photoresist is applied and is exposed and developed by using a mask, the pixel-defining film 215 may include the 1-2$^{nd}$ hole H1-2 and the 2-2$^{nd}$ hole H2-2, and the inner surface H1-2*a* of the 1-2$^{nd}$ hole H1-2 and the inner surface H2-2*a* of the 2-2$^{nd}$ hole H2-2 may each include a forward-tapered inclined surface. However, the disclosure is not limited thereto. For example, the pixel-defining film 215 may be formed by using a negative photoresist, and in this case, the inner surface H1-2*a* of the 1-2$^{nd}$ hole H1-2 and/or the inner surface H2-2*a* of the 2-2$^{nd}$ hole H2-2 may include a reverse-tapered inclined surface. The pixel-defining film 215 may define the opening 215OP through which a central portion of each of the first through third pixel electrodes 210-1, 210-2, and 210-3 is exposed to outside the pixel-defining film 215.

According to the one or more embodiments, a display apparatus 1 capable of reducing leakage current and reducing manufacturing costs may be realized. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:

a substrate comprising a display area comprising a first pixel area and a second pixel area which are adjacent to each other along a first direction, and a peripheral area outside the display area;

an organic insulating layer disposed over the substrate a connection metal layer disposed on the organic insulating layer;

a planarization layer covering the connection metal layer, the planarization layer comprising:

a first inner surface defining a contact hole corresponding to the first pixel area and exposing the connection metal layer to outside the planarization layer, the first inner surface being a forward-tapered inclined surface, and a second inner surface defining a 1-1$^{st}$ hole which is between the first pixel area and the second pixel area along the first direction and exposes a part of the organic insulating layer to outside the planarization layer, the second inner surface being a reverse-tapered inclined surface;

an intermediate layer of a light emitting device layer which is disconnected at the 1-1$^{st}$ hole of planarization layer; and a disconnected portion of the intermediate layer in the 1-1$^{st}$ hole of the planarization layer.

2. The display apparatus of claim 1, wherein the 1-1$^{st}$ hole extends along a second direction which intersects the first direction.

3. The display apparatus of claim 2, wherein the display area further comprises a third pixel area which is adjacent to the first pixel area along the second direction, the planarization layer further comprises a third inner surface defining a 2-1$^{st}$ hole which is between the first pixel area and the third pixel area along the second direction and extends along the first direction, the third inner surface being a reverse-tapered inclined surface, the intermediate layer of the light emitting device layer is further disconnected at the 2-1$^{st}$ hole of the planarization layer, and another disconnected portion of the intermediate layer is in the 2-1$^{st}$ hole of the planarization layer.

4. The display apparatus of claim 3, wherein the 1-1$^{st}$ hole and the 2-1$^{st}$ hole of the planarization layer are connected to each other.

5. The display apparatus of claim 1, further comprising a pixel-defining film disposed on the planarization layer, wherein the pixel-defining film comprises a third inner surface defining a 1-2$^{nd}$ hole overlapping the 1-1$^{st}$ hole.

6. The display apparatus of claim 5, wherein the third inner surface of the 1-2$^{nd}$ hole comprises a forward-tapered inclined surface.

7. The display apparatus of claim 6, wherein the display area further comprises a third pixel area which is adjacent to the first pixel area along a second direction which intersects the first direction, the planarization layer further comprises a fourth inner surface defining a 2-1$^{st}$ hole which is between the first pixel area and the third pixel area along the second direction and extends along the first direction, the fourth inner surface comprising a reverse-tapered inclined surface, the pixel-defining film further comprises a fifth inner surface defining a 2-2$^{nd}$ hole overlapping the 2-1$^{st}$ hole, the fifth inner surface comprising a forward-tapered inclined surface, the intermediate layer of the light emitting device layer is further disconnected at the 2-1$^{st}$ hole of planarization layer, and another disconnected portion of the intermediate layer is in the 2-1$^{st}$ hole of the planarization layer.

8. The display apparatus of claim 7, wherein the 1-2$^{nd}$ hole and the 2-2$^{nd}$ hole of the pixel-defining film are connected to each other.

9. The display apparatus of claim 5, further comprising a pad located in the peripheral area.

10. The display apparatus of claim 9, wherein the planarization layer covers the pad and comprises a fourth inner surface defining a pad hole exposing the pad to outside the planarization layer, the fourth inner surface comprising a forward-tapered inclined surface.

11. The display apparatus of claim 10, wherein a thickness of the planarization layer corresponding to the pad is less than a thickness of the planarization layer corresponding to the display area.

12. The display apparatus of claim 5, further comprising:

a pixel electrode which is between the planarization layer and the pixel-defining film;

a counter electrode covering the pixel-defining film; and the intermediate layer which is between the pixel electrode and the counter electrode.

13. The display apparatus of claim 12, wherein the intermediate layer and the counter electrode cover the third inner surface which defines the 1-2$^{nd}$ hole of the pixel-defining film.

14. The display apparatus of claim 13, wherein the intermediate layer and the counter electrode are outside of the 1-1$^{st}$ hole of the planarization layer.

15. The display apparatus of claim 13, further comprising:

a residual layer in the 1-1$^{st}$ hole of the planarization layer, wherein both the intermediate layer and the counter electrode are disconnected at the 1-1$^{st}$ hole of the planarization layer, and the residual layer comprises the disconnected portion of the intermediate layer together with a disconnected portion of the counter electrode.

16. The display apparatus of claim 15, wherein the residual layer is spaced apart from the second inner surface which defines the 1-1$^{st}$ hole.

* * * * *